(12) United States Patent
Haruta et al.

(10) Patent No.: US 9,257,595 B2
(45) Date of Patent: Feb. 9, 2016

(54) NITRIDE LIGHT-EMITTING DIODE ELEMENT AND METHOD OF MANUFACTURING SAME

(71) Applicant: MITSUBISHI CHEMICAL CORPORATION, Chiyoda-ku (JP)

(72) Inventors: Yuki Haruta, Yokkaichi (JP); Tadahiro Katsumoto, Yokohama (JP); Kenji Shimoyama, Ushiku (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 216 days.

(21) Appl. No.: 14/054,079

(22) Filed: Oct. 15, 2013

(65) Prior Publication Data

US 2014/0103391 A1    Apr. 17, 2014

Related U.S. Application Data

(63) Continuation of application No. PCT/JP2012/059774, filed on Apr. 10, 2012.

(30) Foreign Application Priority Data

Apr. 15, 2011  (JP) .................................. 2011-091396
Feb. 22, 2012  (JP) .................................. 2012-036851

(51) Int. Cl.
*H01L 33/00*  (2010.01)
*H01L 33/22*  (2010.01)
*H01L 33/32*  (2010.01)

(52) U.S. Cl.
CPC ............ *H01L 33/0075* (2013.01); *H01L 33/22* (2013.01); *H01L 33/32* (2013.01); *H01L 2224/13* (2013.01)

(58) Field of Classification Search
None
See application file for complete search history.

(56) References Cited

U.S. PATENT DOCUMENTS 8,247,822 B2 * 8/2012 Cheng .................... H01L 33/20
                                                              257/13
2004/0206969 A1  10/2004 Orita
(Continued)

FOREIGN PATENT DOCUMENTS

JP    2007-214500    8/2007
JP    2007-305909    11/2007
(Continued)

OTHER PUBLICATIONS

International Search Report issued May 15, 2012 in PCT/JP2012/059774 filed Apr. 10, 2012.
(Continued)

*Primary Examiner* — Anthony Ho
*Assistant Examiner* — Samuel Lair
(74) *Attorney, Agent, or Firm* — Oblon, McClelland, Maier & Neustadt, L.L.P.

(57) ABSTRACT

A nitride LED having improved light extraction efficiency and/or axial luminous intensity is provided. The nitride LED contains a nitride semiconductor substrate having, on a front face thereof, a light-emitting structure made of a nitride semiconductor, wherein a roughened region is provided on a back face of the substrate, the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and light generated in the light-emitting structure is output to the exterior through the roughened region.

7 Claims, 32 Drawing Sheets

(56) References Cited

U.S. PATENT DOCUMENTS

| | | | |
|---|---|---|---|
| 2005/0285132 A1* | 12/2005 | Orita | B82Y 20/00 257/99 |
| 2006/0267034 A1 | 11/2006 | Orita | |
| 2007/0108459 A1* | 5/2007 | Lu | H01L 33/22 257/98 |
| 2007/0145557 A1 | 6/2007 | Kamiyama et al. | |
| 2007/0176193 A1* | 8/2007 | Nagai | H01L 33/22 257/98 |
| 2007/0194324 A1* | 8/2007 | Kim | H01L 33/22 257/79 |
| 2007/0267640 A1* | 11/2007 | Lee | H01L 33/14 257/94 |
| 2007/0295952 A1* | 12/2007 | Jang | H01L 33/0079 257/15 |
| 2008/0047929 A1 | 2/2008 | Wang et al. | |
| 2009/0124042 A1 | 5/2009 | Horio et al. | |
| 2010/0072501 A1* | 3/2010 | Wakai | H01L 33/20 257/98 |
| 2010/0096657 A1* | 4/2010 | Ou | H01L 33/22 257/98 |
| 2012/0228670 A1* | 9/2012 | Saito | H01L 33/007 257/103 |

FOREIGN PATENT DOCUMENTS

| | | |
|---|---|---|
| JP | 2008-226962 | 9/2008 |
| JP | 2009-010060 | 1/2009 |
| JP | 2009-094219 | 4/2009 |
| WO | 2009/070809 | 6/2009 |

OTHER PUBLICATIONS

A. Chakraborty et al, Japanese Journal of Applied Physics 44 (2005) L173-L175.

K. Okamoto et al, Japanese Journal of Applied Physics 45 (2006) L1197-L1199.

R. B. Chung et al, Japanese Journal of Applied Physics 49 (2010) 070203.

I.L. Koslow et al, Japanese Journal of Applied Physics 49 (2010) 080203.

H. Zhong et al, Japanese Journal of Applied Physics 48 (2009) 030201.

Y. Zhao et al, Applied Physics Express 3 (2010) 102101.

* cited by examiner

FIG.5(a)
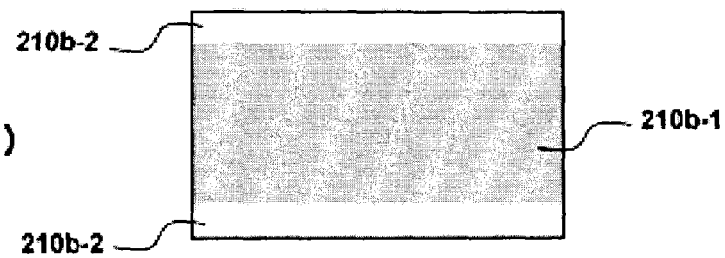
FIG.5(b)
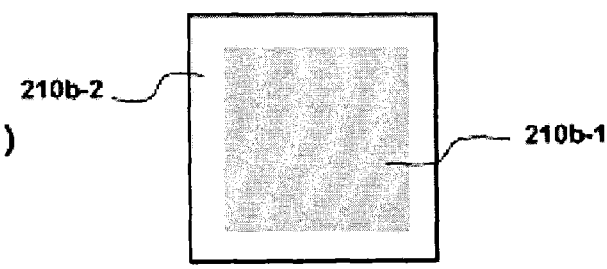
FIG.5(c)
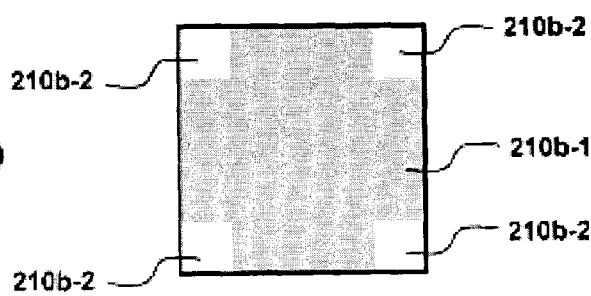
FIG.5(d)
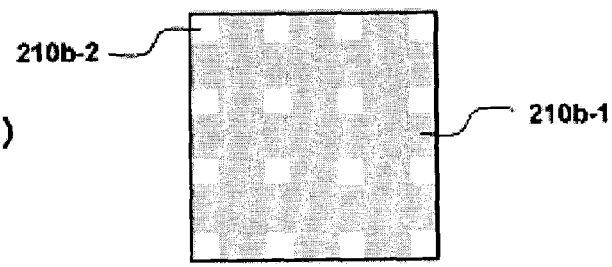
FIG.5 c-AXIS DIRECTION OF GaN

FIG.10(a)
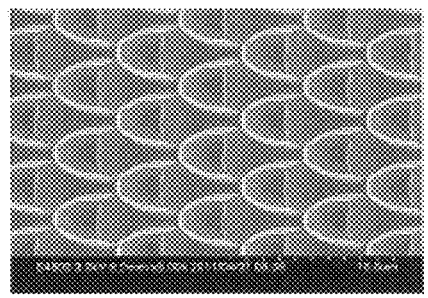
FIG.10(b)
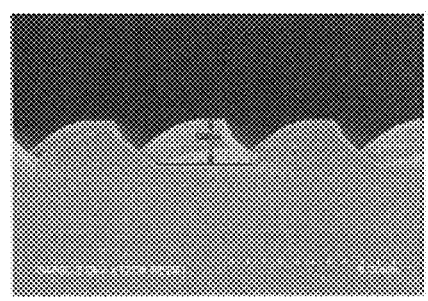
FIG.10(c)
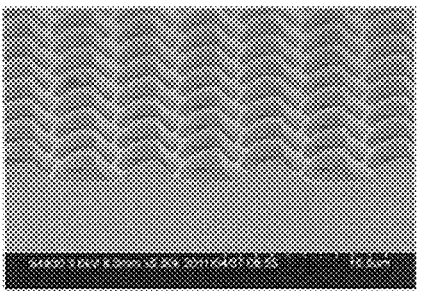
FIG.10

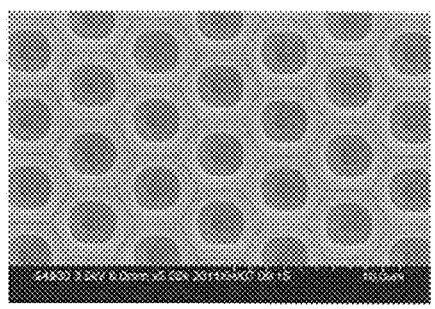
FIG.13(a)
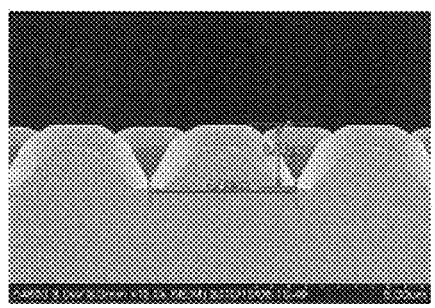
FIG.13(b)
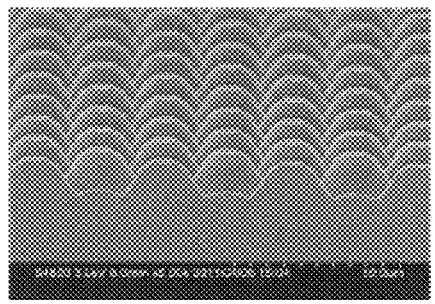
FIG.13(c)
FIG.13

FIG.14(a)
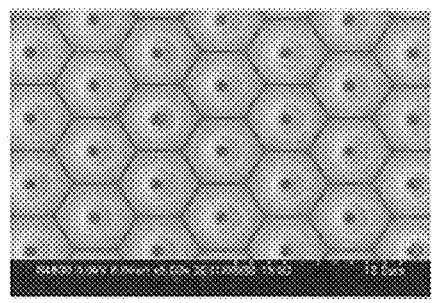
FIG.14(b)
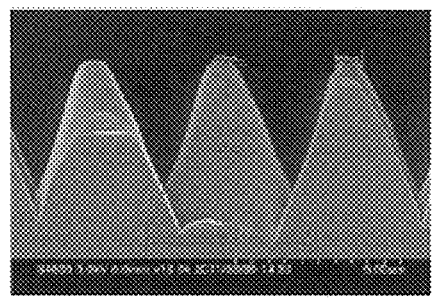
FIG.14(c)
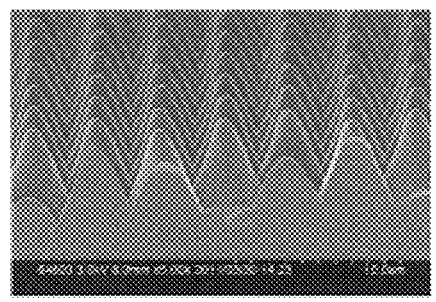
FIG.14

NITRIDE LIGHT-EMITTING DIODE ELEMENT AND METHOD OF MANUFACTURING SAME

CROSS-REFERENCE TO RELATED APPLICATION

This is a continuation of International Application PCT/JP2012/059774, filed on Apr. 10, 2012, and designated the U.S., (and claims priority from Japanese Patent Application 2011-091396 which was filed on Apr. 15, 2011 and Japanese Patent Application 2012-036851 which was filed on Feb. 22, 2012,) the entire contents of which are incorporated herein by reference.

TECHNICAL FIELD

The present invention relates to a nitride light-emitting diode element (also referred to below as a "nitride LED") having a light-emitting structure formed of a nitride semiconductor of the chemical formula $Al_aIn_bGa_{1-a-b}N$ ($0 \le a \le 1$, $0 \le b \le 1$, $0 \le a+b \le 1$). Nitride semiconductors are sometimes called Group III nitride semiconductors or nitride Group III-V compound semiconductors. Nitride semiconductors are also denoted as (Al, Ga, In)N.

BACKGROUND ART

Semiconductor devices that use nitride semiconductors such as GaN, GaInN, AlGaN and AlGaInN are being put to practical use. Typical devices are light-emitting devices such as light-emitting diodes and laser diodes in which a double hetero p-n junction-type light-emitting structure is constructed of a nitride semiconductor. In particular, nitride-type LEDs having a light-emitting structure that has been heteroepitaxially grown on a c-plane sapphire substrate are mass-produced as a light source for backlighting and illumination.

The nitride semiconductor crystals which are used in light-emitting devices have a hexagonal wurtzite structure. It has been reported that because the above-described nitride LEDs which employ a c-plane sapphire substrate have a light-emitting structure wherein the n-type layer, the active layer and the p-type layer making up the light-emitting structure are stacked in the c-axis direction, a piezoelectric field that lowers the light-emitting efficiency forms at the interior of the active layer. One approach that has been proposed for resolving this problem is a non-polar or semi-polar nitride LED obtained by homoepitaxially growing a light-emitting structure on a non-polar or semi-polar GaN substrate (Non-Patent Documents 1, 2, 3 and 4).

As used herein, "non-polar GaN substrate" refers to a GaN substrate whose principal plane is a plane that is tilted 90° to the c plane (such as an m plane or a plane, which plane is called a "non-polar face"). Also, "half-polar GaN substrate" refers to a GaN substrate whose principal plane is a plane having a slope with respect to the c plane which is smaller or larger than a non-polar face (which plane is called a "semi-polar face"). However, a GaN substrate in which the principal plane has a slight slope to the c plane is generally treated as a misoriented c-plane substrate. Nitride semiconductor substrates typically have a misorientation of within 10 degrees.

In nitride LEDs having a light-emitting structure on the Ga-polar face (c+ plane) of a c-plane GaN substrate, attempts are being carried out to improve the light extraction efficiency by using wet etching treatment such as photoelectrochemical (PEC) etching to roughen the substrate back face (N-polar face; c– plane) utilized as the light extraction plane. On the other hand, in nitride LEDs which use a non-polar or half-polar GaN substrate, it has been pointed out that the back face of the substrate cannot be roughened by wet etching (Non-Patent Document 5). Hence, methods that employ dry etching to roughen the back face of the substrate are being investigated for such nitride LEDs (Patent Document 1, Non-Patent Documents 5 and 6).

Patent Document 1: WO 2009/070809

Non-Patent Document 1: A. Chakraborty, B. A. Haskell, S. Keller, J. S. Speck, S. P. DenBaars, S. Nakamura and U. K. Mishra: *Japanese Journal of Applied Physics* 44 (2005), L173

Non-Patent Document 2: K. Okamoto, H. Ohta, D. Nakagawa, M. Sonobe, J. Ichihara and H. Takasu: *Japanese Journal of Applied Physics* 45 (2006), L1197

Non-Patent Document 3: R. B. Chung, Y-D. Lin, I. Koslow, N. Pfaff, H. Ohta, J. Ha, S. P. DenBaars and S. Nakamura: *Japanese Journal of Applied Physics* 49 (2010), 07020

Non-Patent Document 4: I. L. Koslow, J. Sonoda, R. B. Chung, C-C. Pan, S. Brinkley, H. Ohta, S. Nakamura and S. P. DenBaars: *Japanese Journal of Applied Physics* 49 (2010), 080203

Non-Patent Document 5: H. Zhong, A. Tyagi, N. Pfaff, M. Saito, K. Fujito, J. S. Speck, S. P. DenBaars and S. Nakamura: *Japanese Journal of Applied Physics* 48 (2009), 030201

Non-Patent Document 6: Y. Zhao, J. Sonoda, C-C. Pan, S. Brinkley, I. Koslow, K. Fujito, H. Ohta, S. P. DenBaars and S. Nakamura: *Applied Physics Express* 3 (2010) 102101

DISCLOSURE OF THE INVENTION

The object of one aspect of the invention is to provide a nitride LED in which both or at least one of the light extraction efficiency and the axial luminous intensity are improved, and a method of manufacturing such an LED.

The object of another aspect of the invention is to provide a nitride LED which has a light-emitting structure formed on a semi-polar nitride semiconductor substrate or a semi-polar nitride semiconductor layer and in which both or at least one of the light extraction efficiency and the axial luminous intensity are improved, and a method of manufacturing such an LED.

The object of yet another aspect of the invention is to provide an improved light-emitting device that uses a nitride LED which has a light-emitting structure on the front face of a nitride semiconductor substrate and is provided with a roughened region on the back face of the substrate. More specifically, the object is to provide a light-emitting device in which fluctuations in the light-emitting properties due to deformation or destruction of the roughened face included in the roughened region have been prevented from occurring.

It should be noted, however, that the objects of the invention are not limited to those mentioned above.

According to a first aspect of the invention, the following nitride LEDs and methods of manufacturing nitride LEDs are provided.

(A1) A nitride LED comprising a nitride semiconductor substrate having, on a front face thereof, a light-emitting structure made of a nitride semiconductor, wherein a roughened region is provided on a back face of the substrate, the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and light generated in the light-emitting structure is output to the exterior through the roughened region.

(A2) A nitride LED comprising a nitride semiconductor stack which comprises a nitride semiconductor substrate and a light-emitting portion formed of a nitride semiconductor having a multilayer film structure stacked on the substrate, wherein a roughened region is provided on a substrate side face of the stack, the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and light generated in the light-emitting portion is output to the exterior through the roughened region.

(A3) A nitride LED comprising a plurality of nitride semiconductor layers which comprise an n-type nitride semiconductor layer, an active layer and a p-type nitride semiconductor layer and are stacked on one face of a first nitride semiconductor layer, wherein a roughened region is provided on another face of the first nitride semiconductor layer, the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and light generated in the active layer is output to the exterior through the roughened region.

(A4) The nitride LED according to any one of (A1) to (A3) above, wherein each of the plurality of protrusions has a peripheral shape which, in a top view of the roughened region, is a hexagon.

(A5) The nitride LED according to (A4) above, wherein each of the plurality of protrusions has a peripheral shape which, in a top view of the roughened region, is a regular hexagon.

(A6) The nitride LED according to (A5) above, wherein each of the plurality of protrusions is located at a lattice position of a triangular lattice, and each of the plurality of protrusions has a height which is from 0.4 to 1.5 times the pitch of the triangular lattice.

(A7) The nitride LED according to any one of (A1) to (A6) above, wherein each of the plurality of protrusions has a height of from 1 to 8 μm.

(A8) A method of manufacturing a nitride LED, comprising a first step of providing a roughened region on a back face of a nitride semiconductor substrate having, on a front face thereof, a light-emitting structure made of a nitride semiconductor, wherein the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and in the first step, the roughened region is formed by dry etching treatment of the substrate.

(A9) A method of manufacturing a nitride LED, comprising:

a first step of preparing a nitride semiconductor stack which comprises a nitride semiconductor substrate and a light-emitting portion formed of a nitride semiconductor having a multilayer film structure stacked on the substrate; and a second step of providing a roughened region on a substrate side face of the stack, wherein the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and in the second step, the roughened region is formed by dry etching treatment of the nitride semiconductor stack.

(A10) A method of manufacturing a nitride LED, comprising:

a first step of preparing a multilayer structure in which a plurality of nitride semiconductor layers including an n-type nitride semiconductor layer, an active layer and a p-type nitride semiconductor layer are stacked on one face of a first nitride semiconductor layer; and a second step of providing a roughened region on another face of the first nitride semiconductor layer, wherein the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and in the second step, the roughened region is formed by dry etching treatment of the first nitride semiconductor layer.

(A11) The manufacturing method according to any one of (A8) to (A10) above, wherein each of the plurality of protrusions has a peripheral shape which, in a top view of the roughened region, is a hexagon.

(A12) The manufacturing method according to (A11) above, wherein each of the plurality of protrusions has a peripheral shape which, in a top view of the roughened region, is a regular hexagon.

(A13) The manufacturing method according to (A12) above, wherein each of the plurality of protrusions is located at a lattice position of a triangular lattice, and each of the plurality of protrusions has a height which is from 0.4 to 1.5 times the pitch of the triangular lattice.

(A14) The manufacturing method according to any one of (A8) to (A13) above, wherein each of the plurality of protrusions has a height of from 1 to 8 μm.

According to a second aspect of the invention, the following nitride LEDs and methods of manufacturing nitride LEDs are provided.

(B1) A nitride LED comprising a nitride semiconductor substrate having, on a front face thereof, a light-emitting structure made of a nitride semiconductor, wherein a roughened region is provided on a back face of the substrate, the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and light generated in the light-emitting structure is output to the exterior through the roughened region.

(B2) A nitride LED having a nitride semiconductor stack which comprises a nitride semiconductor substrate and a light-emitting portion formed of a nitride semiconductor having a multilayer film structure stacked on the substrate, wherein a roughened region is provided on a substrate side face of the stack, the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and light generated in the light-emitting portion is output to the exterior through the roughened region.

(B3) A nitride LED having a plurality of nitride semiconductor layers which comprise an n-type nitride semiconductor layer, an active layer and a p-type nitride semiconductor layer and are stacked on one face of a first nitride semiconductor layer, wherein a roughened region is provided on another face of the first nitride semiconductor layer, the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and light generated in the active layer is output to the exterior through the roughened region.

(B4) The nitride LED according to any one of (B1) to (B3) above, wherein each of the plurality of protrusions has a peripheral shape which, in a top view of the roughened region, is a hexagon.

(B5) The nitride LED according to (B4) above, wherein each of the plurality of protrusions has a peripheral shape which, in a top view of the roughened region, is a regular hexagon.

(B6) The nitride LED according to any one of (B1) to (B5) above, wherein each of the plurality of protrusions is located at a lattice position of a triangular lattice, and each of the plurality of protrusions has a height which is from 0.4 to 1.5 times the pitch of the triangular lattice.

(B7) The nitride LED according to any one of (B1) to (B6) above, wherein each of the plurality of protrusions has a height of from 1 to 8 µm.

(B8) A method of manufacturing a nitride LED, comprising a first step of providing a roughened region on a back face of a nitride semiconductor substrate having, on a front face thereof, a light-emitting structure made of a nitride semiconductor, wherein the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and in the first step, the roughened region is formed by dry etching treatment of the substrate.

(B9) A method of manufacturing a nitride LED, comprising:

a first step of preparing a nitride semiconductor stack which comprises a nitride semiconductor substrate and a light-emitting portion formed of a nitride semiconductor having a multilayer film structure stacked on the substrate; and a second step of providing a roughened region on a substrate side face of the stack, wherein the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and in the second step, the roughened region is formed by dry etching treatment of the nitride semiconductor stack.

(B10) A method of manufacturing a nitride LED, comprising:

a first step of preparing a multilayer structure in which a plurality of nitride semiconductor layers including an n-type nitride semiconductor layer, an active layer and a p-type nitride semiconductor layer are stacked on one face of a first nitride semiconductor layer; and a second step of providing a roughened region on another face of the first nitride semiconductor layer, wherein the roughened region has a plurality of protrusions, each of the plurality of protrusions has a top point or top plane and has a horizontal cross-section which is circular, except in areas where the protrusion is tangent to other neighboring protrusions, and which has a surface area that decreases on approaching the top point or top plane, the plurality of protrusions are arranged such that any one protrusion is in contact with six other protrusions, and in the second step, the roughened region is formed by dry etching treatment of the first nitride semiconductor layer.

(B11) The manufacturing method according to any one of (B8) to (B10) above, wherein each of the plurality of protrusions has a peripheral shape which, in a top view of the roughened region, is a hexagon.

(B12) The manufacturing method according to (B11) above, wherein each of the plurality of protrusions has a peripheral shape which, in a top view of the roughened region, is a regular hexagon.

(B13) The manufacturing method according to any one of (B8) to (B12) above, wherein each of the plurality of protrusions is located at a lattice position of a triangular lattice, and each of the plurality of protrusions has a height which is from 0.4 to 1.5 times the pitch of the triangular lattice.

(B14) The manufacturing method according to any one of (B8) to (B13) above, wherein each of the plurality of protrusions has a height of from 1 to 8 µm.

According to a third aspect of the invention, the following nitride LEDs and methods of manufacturing nitride LEDs are provided.

(C1) A nitride LED having a semi-polar nitride semiconductor substrate with, on a Ga-rich face thereof, a light-emitting structure made of a nitride semiconductor, wherein the nitride LED has formed, on a N-rich face of the substrate by dry-etching treatment of the substrate, protrusions which have a top point or top plane and for which the surface area of a cross-section orthogonal to the height direction thereof decreases on approaching the top point or top plane.

(C2) A nitride LED having a nitride semiconductor stack which comprises a semi-polar nitride semiconductor substrate and a light-emitting portion formed of a nitride semiconductor having a multilayer film structure stacked on a Ga-rich face of the substrate, which nitride LED has formed, on a nitride semiconductor substrate side face of the nitride semiconductor stack by dry-etching treatment of the stack, protrusions which have a top point or top plane and for which the surface area of a cross-section orthogonal to the height direction thereof decreases on approaching the top point or top plane.

(C3) A nitride LED having a plurality of nitride semiconductor layers which comprise an n-type nitride semiconductor layer, an active layer and a p-type nitride semiconductor layer stacked on the Ga-rich face of a first nitride semiconductor layer having a Ga-rich face and a N-rich face, which nitride LED has formed, on the N-rich face of the first nitride semiconductor layer by dry-etching treatment of the first nitride semiconductor layer, protrusions which have a top point or top plane and for which the surface area of a cross-section orthogonal to the height direction thereof decreases on approaching the top point or top plane.

(C4) The nitride LED according to any one of (C1) to (C3) above, wherein the protrusions have a height of from 1 to 8 μm.

(C5) The nitride LED according to any one of (C1) to (C4) above, wherein each of the plurality of protrusions is located at a lattice position of a triangular lattice and each protrusion has a height which is from 0.4 to 1.5 times the pitch of the triangular lattice.

(C6) The nitride LED according to any one of (C1) to (C5) above, wherein the plurality of protrusions are arranged so that any one protrusion is in contact with at least four other protrusions.

(C7) A method of manufacturing a nitride LED, which method comprises the step of forming on a N-rich face of a semi-polar nitride semiconductor substrate, by dry-etching treatment of the substrate, protrusions which have a top point or top plane and for which the surface area of a cross-section orthogonal to the height direction thereof decreases on approaching the top point or top plane.

(C8) A method of manufacturing a nitride LED, which method comprises the step of forming on a nitride semiconductor substrate side face of a nitride semiconductor stack which includes a semi-polar nitride semiconductor substrate and a light-emitting portion composed of a nitride semiconductor having a multilayer film structure stacked on a Ga-rich face of the substrate, by dry-etching treatment of the substrate, protrusions which have a top point or top plane and for which the surface area of a cross-section orthogonal to the height direction thereof decreases on approaching the top point or top plane.

(C9) A method of manufacturing a nitride LED, which method includes the step of preparing a stacked structure having a plurality of nitride semiconductor layers which include an n-type nitride semiconductor layer, an active layer and a p-type nitride semiconductor layer stacked on the Ga-rich face of a first nitride semiconductor layer having a Ga-rich face and a N-rich face; and the step of forming on the N-rich face of the first nitride semiconductor layer, by dry etching treatment of the first nitride semiconductor layer, protrusions which have a top point or top plane and for which the surface area of a cross-section orthogonal to the height direction thereof decreases on approaching the top point or top plane.

(C10) The manufacturing method according to any one of (C7) to (C9) above, wherein the protrusions have a height of from 1 to 8 μm.

(C11) The manufacturing method according to any one of (C7) to (C10) above, wherein each of the plurality of protrusions is located at a lattice position of a triangular lattice and each protrusion has a height which is from 0.4 to 1.5 times the pitch of the triangular lattice.

(C12) The manufacturing method according to any one of (C7) to (C11) above, wherein the plurality of protrusions are arranged so that any one protrusion is in contact with at least four other protrusions.

According to a fourth aspect of the invention, the following light-emitting devices are provided.

(D1) A light-emitting device having a supporting member on which is mounted a nitride LED having a light-emitting structure made of a nitride semiconductor substrate with a nitride semiconductor on a front face thereof, wherein a roughened region and a flat region are provided on a back face of the substrate, the roughened region diffuses light generated in the light-emitting structure, and the flat region is in planar contact with the supporting member through an intervening bonding material.

(D2) The light-emitting device according to (D1) above, wherein a plurality of the flat regions are provided on the back face of the substrate, and at least one of the plurality of flat regions is surrounded about the periphery thereof by the roughened region.

(D3) The light-emitting device according to (D1) or (D2) above, wherein the supporting member has a reflective face at a portion of the device where the nitride LED is mounted.

(D4) The light-emitting device according to (D3) above, wherein the reflective face is formed of a reflecting material that includes a white ceramic, a white resin, silver or aluminum.

(D5) A light-emitting device having a supporting member on which is mounted a nitride LED having a light-emitting structure made of an electrically conductive nitride semiconductor substrate with a nitride semiconductor on a front face thereof, wherein a roughened region and a flat region are provided on a back face of the substrate, which flat region has formed thereon an electrode pad that is electrically connected to the light-emitting structure through the substrate and which roughened region diffuses light generated in the light-emitting structure, and the supporting member has an electrode layer on a surface thereof, the electrode pad being in planar contact with the electrode layer through an intervening electrically conductive bonding material.

(D6) The light-emitting device according to (D5) above, wherein a plurality of the flat regions are provided on the back face of the substrate, and at least one of the plurality of flat regions is surrounded about the periphery thereof by the roughened region.

(D7) The light-emitting device according to any one of (D1) to (D5) above, wherein the nitride LED and the supporting member have a gap therebetween which is filled with an underfill.

(D8) The light-emitting device according to any one of (D1) to (D7) above, wherein a plurality of protrusions are formed in the roughened region, and each of the plurality of protrusions has a height of not more than 2 μm.

According to one embodiment of the invention, there is provided a nitride LED in which both or at least one of the light extraction efficiency and the axial luminous intensity are improved, and also a method of manufacture thereof.

According to another embodiment of the invention, there is provided a nitride LED which has a light-emitting structure formed on a semi-polar nitride semiconductor substrate or a semi-polar nitride semiconductor layer and in which both or at least one of the light extraction efficiency and the axial luminous intensity are improved, and also a method of manufacture thereof.

According to yet another embodiment of the invention, there is provided a light-emitting device which uses a nitride LED that has a light-emitting structure on the front face of a nitride semiconductor substrate and is provided with a roughened region on the back face of the substrate, in which light-emitting device fluctuations in the light-emitting properties due to deformation or destruction of the roughened surface included in the roughened region are prevented from occurring.

Other advantageous effects described in this specification are also produced by this invention according to the particular embodiment.

BRIEF DESCRIPTION OF THE DRAWINGS

FIG. 5 presents plan views showing the patterns formed by roughened regions and flat regions on the back faces of GaN substrates.

FIG. 10 presents SEM images of a RIE-treated m-plane GaN substrate, with FIG. 10(a) being a top view, FIG. 10(b) being a side view and FIG. 10(c) being a perspective view.

FIG. 13 presents SEM images of the c– plane of a RIE-treated c-plane GaN substrate, with FIG. 13(a) being a top view, FIG. 13(b) being a side view and FIG. 13(c) being a perspective view.

FIG. 14 presents SEM images of the c– plane of a RIE-treated c-plane GaN substrate, with FIG. 14(a) being a top view, FIG. 14(b) being a side view and FIG. 14(c) being a perspective view.

BEST MODE FOR CARRYING OUT THE INVENTION

In the present specification, c-plane substrates without misorientation (flat substrates) and c-plane substrates with misorientation are collectively referred to as "c-plane substrates." The same applies also to m-plane substrates, c-plane nitride semiconductor substrates and m-plane nitride semiconductor substrates. With regard to the terms "Ga-rich face" and "N-rich face" in this specification, reference may be made to Samantha C. Cruz et al., Journal of Crystal Growth 311 (2009), 3817-3823.

In this specification, the "front face" and "back face" of a nitride semiconductor substrate, and the "front side" and "back side" of a nitride LED having a nitride semiconductor substrate with a light-emitting structure thereon are defined as follows. The nitride semiconductor substrate included in a nitride LED has two principal planes. Of these, the principal plane on the side where an epitaxial film that makes up the light-emitting structure is formed is called the "front face," and the principal plane on the opposite side is called the "back face." The "front side" and "back side" of a nitride LED having a nitride semiconductor substrate with a light-emitting structure thereon are defined as follows: when the nitride LED is viewed from the "front side" thereof, the epitaxial film making up the light-emitting structure is closer than the substrate; when the nitride LED is viewed from the "back side" thereof, the substrate is closer than the epitaxial film.

On the other hand, with regard to nitride LEDs manufactured by a method wherein, following formation of a light-emitting structure, a supporting substrate is bonded to the epitaxial film that includes the light-emitting structure and some or all of the single-crystal substrate used in growing the epitaxial film is cut away from the epitaxial film, "front side" and "back side" shall not be particularly defined. However, of the two principal planes of the single-crystal substrate used in this manufacturing method, the principal plane of the side used for growth of the epitaxial film shall be called the "front face," and the principal plane on the opposite side shall be called the "back face."

Embodiment 1

Figure 1:
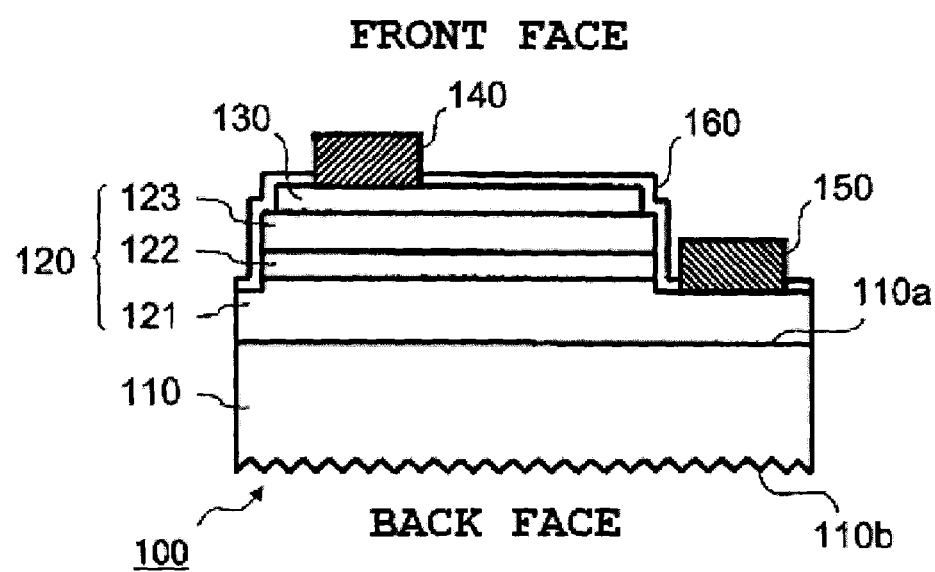
FIG. 1 is a cross-sectional view showing the structure of a nitride LED according to one embodiment of the invention.

FIG. 1 is a cross-sectional diagram showing the structure of a nitride LED 100 according to Embodiment 1.

The nitride LED 100 has, on a front face 110a of a GaN substrate 110, a multilayer epitaxial film 120 composed of a nitride semiconductor. The multilayer epitaxial film 120 includes a double hetero p-n junction-type light-emitting structure having an n-type layer 121, a p-type layer 123 and, interposed therebetween, an active layer 122. The entire back face 110b of the GaN substrate 110 has been treated by reactive ion etching (RIE) to give a rough face. In cases where the GaN substrate 110 is a c-plane substrate, given that epitaxial growth of a nitride semiconductor is possible on a c+ plane, the front face is a c+ plane and the back face is a c− plane. In cases where the GaN substrate 110 is a semi-polar substrate, epitaxial growth of the nitride semiconductor is possible on both a Ga-rich face and a N-rich face. However, for reasons described later in this specification, the LED was constructed in such a way as to have the front face be the Ga-rich face.

A translucent electrode 130 composed of indium tin oxide (ITO) is formed on the surface of the p-type layer 123. A p-type electrode pad 140 is formed on part of the translucent electrode 130. An n-type electrode pad 150 is formed on the surface of the n-type layer 121 exposed at a site where the p-type layer 123 and the active layer 122 have been partially removed. A passivation film 160 composed of $SiO_2$ covers the surface on the front side of the nitride LED 100 (excluding the surface of the electrode pad). Here, in cases where sufficient n-type conductivity is imparted to the GaN substrate 110 by doping, instead of forming the n-type electrode pad 150 on the surface of the n-type layer 121, it may be formed on part of the back face 110b of the GaN substrate.

Numerous protrusions are regularly arranged on the back face 110b of a GaN substrate that has been roughened by RIE treatment. The topographically uneven surface resulting from the regular arrangement of protrusions can be formed by RIE treatment using a periodic mask pattern. Light generated in the light-emitting structure is diffused by the roughened back face 110b of the GaN substrate, as a result of which multiple reflection at the interior of the LED 100 is suppressed, improving the light extraction efficiency. Also, the roughened back face 110b of the GaN substrate has a lower reflectance to light that enters from the light-emitting structure side, which helps to improve the light extraction efficiency.

To obtain an even higher improvement effect, it is desirable to increase the density of the protrusions on the back face 110b of the GaN substrate. Accordingly, one of the best regular arrangements is a triangular lattice arrangement; that is, an arrangement in which the protrusions are located at the lattice positions of a triangular lattice.

Figure 8:
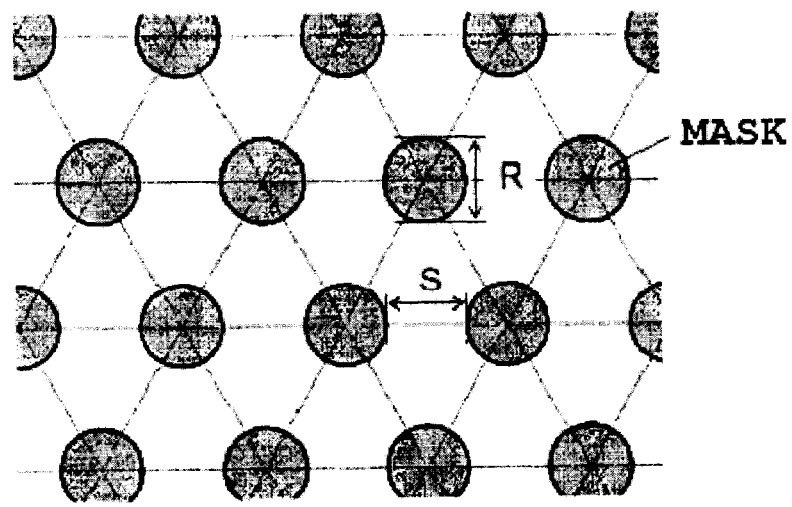
FIG. 8 shows a master pattern that can be used when roughening a GaN substrate by RIE treatment.

To obtain a roughened face in which the protrusions are arranged as a triangular lattice, the back face of the GaN substrate may be, for example, RIE treated using the master pattern shown in FIG. 8. Such a pattern in which circular etching masks are arranged at the lattice positions of a triangular lattice has the advantage that it can be easily fabricated to a relatively high precision. In cases where the GaN substrate 110 is a c-plane substrate, by RIE treating the back face (c− plane) using this master pattern, as shown in FIGS. 13 and 14, a roughened face having a very high light extraction efficiency improving effect can be formed. In the roughened faces shown in these diagrams, because a plurality of protrusions which have, respectively, conical shapes or truncated conical shapes, are formed without intervals therebetween, as shown in FIG. 13(a) and FIG. 14(a), in a top view of the roughened face, each protrusion has a peripheral shape that is a regular hexagon.

The height of the protrusions having conical or truncated conical shapes is set so as to be at least the same as the wavelength within the GaN substrate 110 of the light generated in the active layer 122. Also, it is preferable for this height to be set to from 0.4 to 1.5 times the pitch of the triangular lattice. The light that can be emitted by a GaN LED has a broad wavelength range of from ultraviolet light to green light, although by setting the height of the protrusions within a range of from 1 μm to 8 μm, at least one of the light extraction efficiency and the axial luminous intensity can be advantageously improved. As used herein, "height of the protrusions" refers to the height of protrusions as measured using the deepest areas formed by etching as the reference point.

Figure 24:
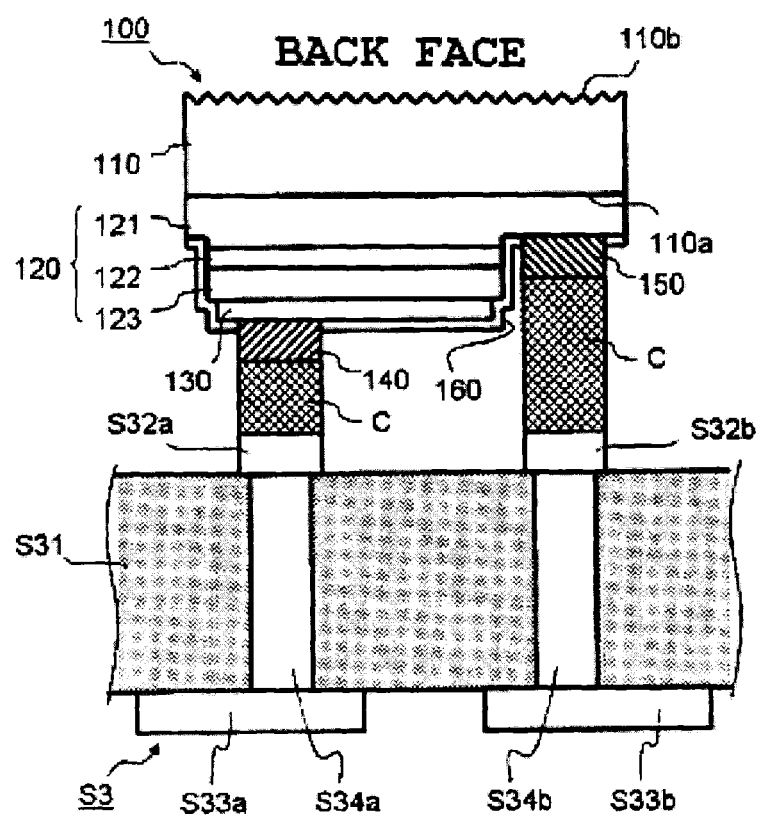
FIG. 24 is a cross-sectional view showing the structure of a light-emitting device in which a nitride LED according to an embodiment of the invention has been flip-chip mounted on a supporting member.

To construct the light-emitting device, the nitride LED 100 is mounted on a supporting member (e.g., a submount) on the surface of which an electrode has been provided. Preferably, as illustrated in FIG. 24, the nitride LED is mounted so that the front side thereof faces the supporting member. This manner of mounting is called "flip-chip mounting."

In FIG. 24, the supporting member S3 has a ceramic insulating substrate S31, a pair of upper electrode layers S32a, S32b provided on the surface thereof, and a pair of lower electrode layers S33a, S33b provided on the bottom face thereof. The upper electrode layer S32a and lower electrode layer S33a are electrically connected by a connecting metal portion S34a that has been filled into a via formed in the insulating substrate. The upper electrode layer S32b and lower electrode layer S33b are electrically connected by a connecting metal portion S34b that has been filled into another via in the insulating substrate.

The p-type electrode pad 140 and n-type electrode pad 150 of the nitride LED 100 each are bonded using the upper electrode layers S32a, S32b and a conductive bonding material C. For example, a solder (e.g., AuSn solder), metal bumps (e.g., gold bumps) or a conductive paste (e.g., silver paste) may be used as the conductive bonding material C.

By rendering the back face 110b of the GaN substrate into the roughened face shown in FIG. 13 or FIG. 14, the axial luminous intensity of the flip-chip mounted nitride LED 100 can be made very high. Making the axial luminous intensity of the LED high is preferable for improving the output of the light-emitting device in which the LED has been used.

Figure 25:
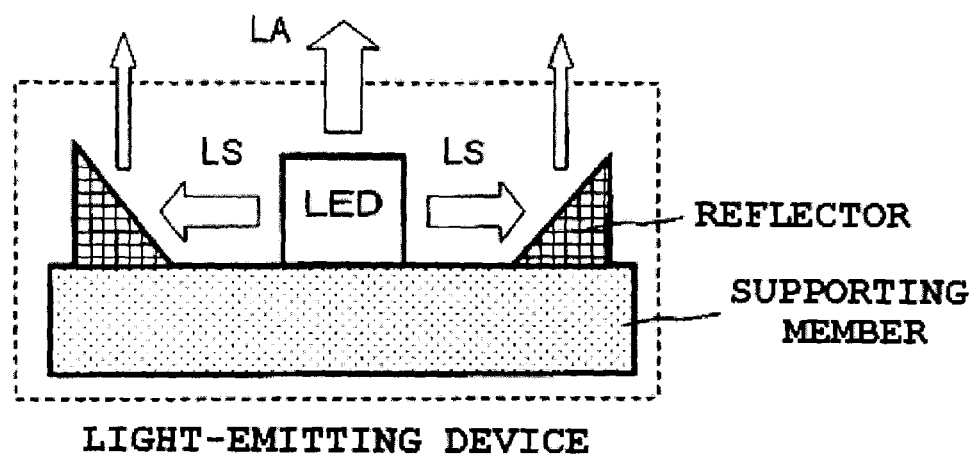
FIG. 25 is diagram (cross-sectional diagram) illustrating that a high axial luminous intensity of the LED is preferable for improving the output of a light-emitting device using the LED.

This is explained in conjunction with FIG. 25. In light-emitting devices that use LEDs, a reflector which reflects in the axial direction light $L_S$ that is emitted laterally from the LED is often used in order to increase the directionality. However, when an LED having a high axial luminous intensity is used, the light $L_A$ that is directly emitted axially from the LED increases without relying on the help of a reflector. Therefore, the decrease in output owing to the loss that occurs when light $L_S$ is reflected with a reflector becomes smaller. When the axial luminous intensity of the LED is sufficiently high, it is even possible to omit a reflector.

Figure 26:
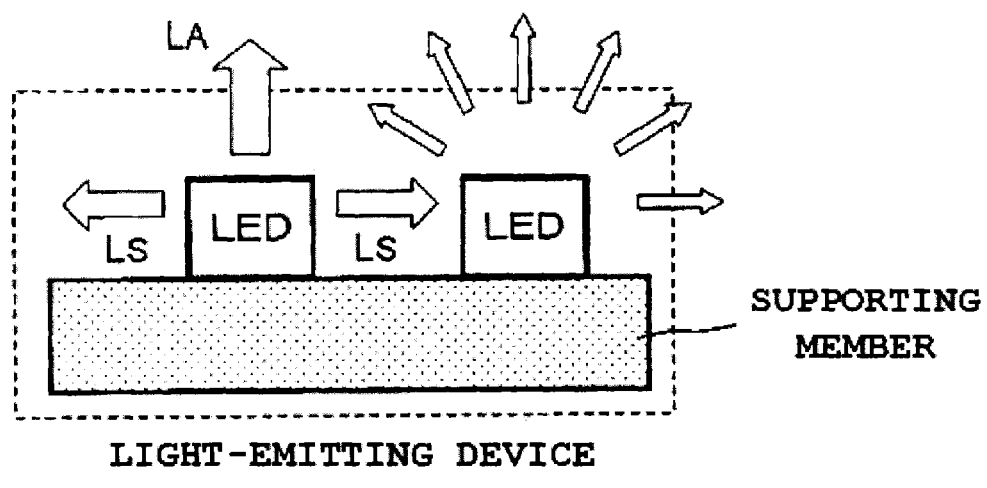
FIG. 26 is diagram (cross-sectional diagram) illustrating that a high axial luminous intensity of the LED is preferable for improving the output of a light-emitting device using the LED.

An LED having a high axial luminous intensity is also advantageous in light-emitting devices of a type where a plurality of LEDs are arrayed on a flat plane. In this type of light-emitting device, as shown in FIG. 26, because the light $L_S$ emitted laterally from a single LED undergoes absorption and scattering due to the other LEDs, this leads to a decrease in output. By contrast, light $L_A$ that is directly emitted axially from an LED is not readily affected by the other LEDs. Therefore, by using LEDs having a high axial luminous intensity, it is possible to obtain such a light-emitting device in which the decrease in output due to absorption and scattering by other LEDs is reduced.

Figure 15A:
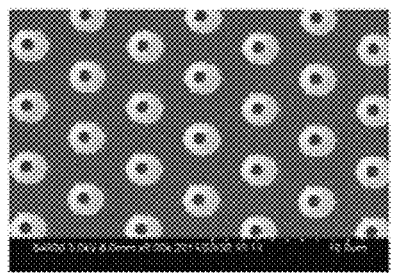
FIG. 15 presents SEM images of the c+ plane of a RIE-treated c-plane GaN substrate, with FIG. 15(a) being a top view, FIG. 15(b) being a side view and FIG. 15(c) being a perspective view.
Figure 15B:
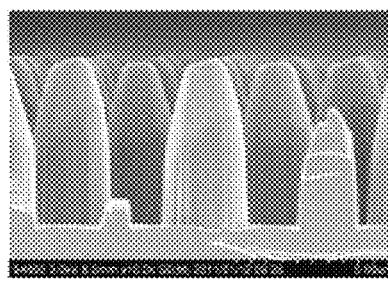
Figure 15C:
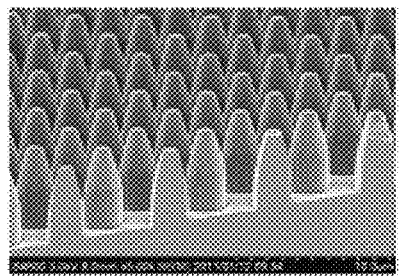

However, even when treatment is carried out using the same mask pattern and RIE conditions, roughened faces of completely different shapes are formed on the c+ plane (Ga-polar face) and the c− plane (N-polar face) of the c-plane GaN substrate. FIG. 15 shows SEM images of the roughened face (protrusion height, about 6 μm) obtained by treating the c+ plane of a GaN substrate using the same etching mask and RIE conditions as when forming the roughened face shown in FIG. 14. FIG. 15(a) is a plan view, FIG. 15(b) is a side view, and FIG. 15(c) is a perspective view. When the c− plane was RIE treated, conical protrusions having gradually inclined sidewalls formed, whereas protrusions in the shape of elongated cylinders formed on the c+ plane. As shown by the results in the subsequently described simulation, the axial luminous intensity of flip-chip mounted LEDs is lower when the protrusions in the roughened region provided on the back face of the substrate are cylindrical in this way than when the protrusions are conical.

The inventors have discovered in semi-polar GaN substrates as well a phenomenon similar to that observed on c− plane substrates. That is, when a N-rich face is RIE treated, a roughened face on which protrusions with gradually sloping sidewalls are densely arrayed can be obtained, whereas a roughened face on which elongated columnar protrusions are arranged with intervals therebetween tends to form when a Ga-rich face is RIE treated. Several specific examples demonstrating this are given below.

Figure 16A:
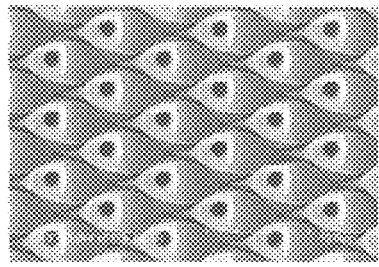
FIG. 16 presents SEM images of the N-rich face of a RIE-treated semi-polar (20-21) GaN substrate, FIG. 16(a) being a top view and FIG. 16(b) being a perspective view.
Figure 16B:
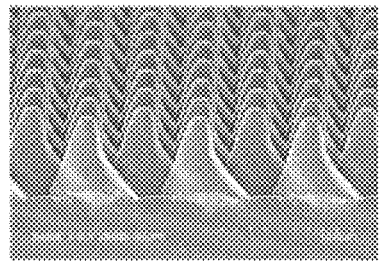

FIG. 16 shows SEM images of a roughened face obtained by using the mask pattern shown in FIG. 8 to RIE treat the nitrogen-rich (20-21) plane of a semi-polar GaN substrate in which one principal plane is a (20-21) plane and the other principal plane is a (20-2-1) plane. Chlorine was used as the etching gas. The etching mask was formed of $SiO_2$ and the height of the protrusions was about 6 μm. In FIG. 16(a), which is a plan view, the vertical direction is the a-axis direction of GaN. Hence, the width of the protrusions in the direction perpendicular to the a-axis is larger than the width in the a-axis direction. As used herein, "width" signifies the total width. The same applies below wherever reference is made to the width of protrusions. As shown in the perspective view in FIG. 16(b), each protrusion has as part of the sidewall a gradually sloped face.

As is apparent from FIG. 16(a), each protrusion is in contact, without intervals therebetween, with four surrounding protrusions, i.e., other protrusions located respectively to the right and above, to the right and below, to the left and above and to the left and below in the diagram. In this diagram, intervals are present between mutually neighboring protrusions in the left-right direction and between mutually neighboring protrusions in the vertical direction, although these intervals are not large.

Figure 17:
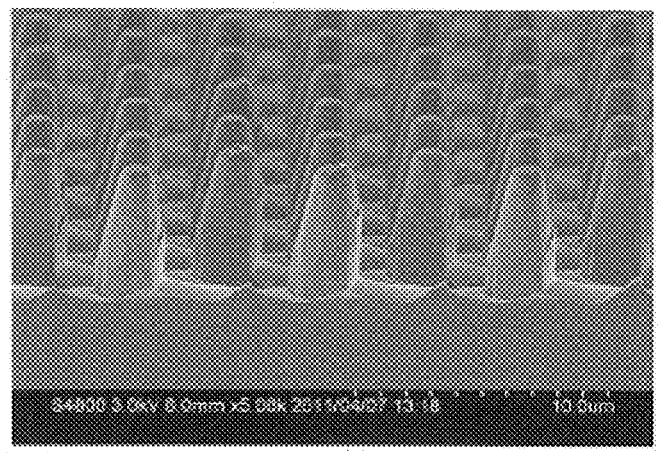
FIG. 17 presents a SEM image (perspective view) of the Ga-rich face of a RIE-treated semi-polar (20-21) GaN substrate.

FIG. 17 shows a SEM image of a roughened face (height of protrusions, about 6 μm) obtained by using the same mask pattern and RIE conditions to treat the (20-2-1) plane (Ga-rich face) of the same semi-polar GaN substrate. It is apparent that elongated columnar protrusions are arranged with large intervals therebetween on this roughened face.

Figure 18A:
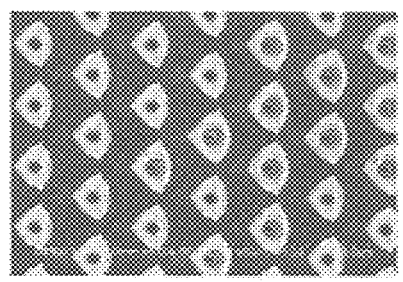
FIG. 18 presents SEM images of the Ga-rich face of a RIE-treated semi-polar (10-1-1) GaN substrate, FIG. 18(a) being a top view and FIG. 18(b) being a perspective view.
Figure 18B:
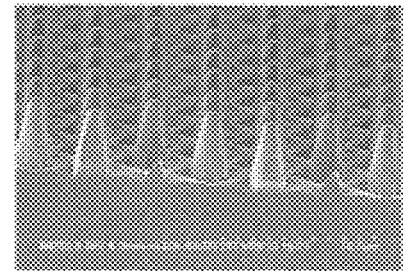

FIG. 18 shows SEM images of roughened faces obtained by using the mask pattern shown in FIG. 8 to RIE treat the (10-1-1) plane (Ga-rich face) of a semi-polar GaN substrate on which one principal plane is a (10-1-1) plane and the other principal plane is a (10-11) plane. The etching mask is formed of $SiO_2$, and the height of the protrusions is about 6 μm. In FIG. 18(a), which is a plan view, the vertical direction is the a-axis direction of GaN. Hence, the protrusions have a width in the a-axis direction which is wider than the width in the direction perpendicular to the a-axis. As shown in FIG. 18(a) and in FIG. 18(b) (perspective view), the protrusions are in the form of elongated columns and are arranged with large intervals therebetween.

Figure 27A:
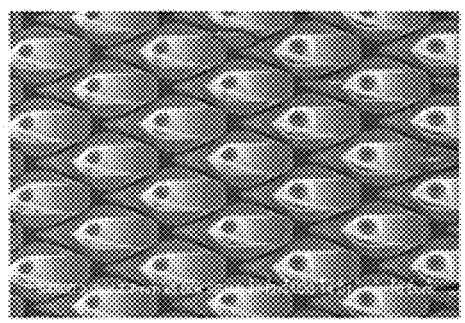
FIG. 27 presents SEM images of the N-rich face of a RIE-treated semi-polar (10-1-1) GaN substrate, FIG. 27(a) being a top view and FIG. 27(b) being a perspective view.
Figure 27B:
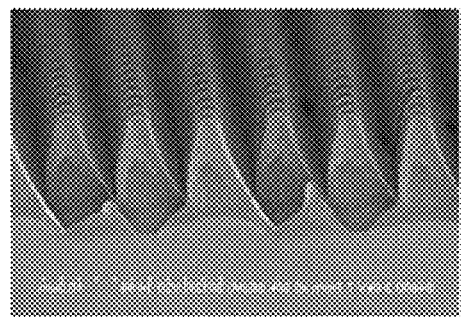

FIG. 27 shows SEM images of the roughened face (height of protrusions, about 6 μm) obtained by using the same mask pattern and RIE conditions to treat the (10-11) plane (N-rich face) of the same semi-polar GaN substrate. As is apparent from FIG. 27(a), which is a plan view, each protrusion is in contact with four surrounding protrusions, i.e., other protrusions located respectively to the right and above, to the right and below, to the left and above and to the left and below in the diagram. In this diagram, intervals are present between mutually neighboring protrusions in the left-right direction and between mutually neighboring protrusions in the vertical direction, although these intervals are not large. As shown in FIG. 27(b), which is a perspective view, each protrusion has as part of the sidewall a gradually sloped face.

Based collectively on the results of the above observations and the results of the subsequently described simulation, in order to manufacture LEDs which have a high axial luminous intensity when flip-chip mounted by using a semi-polar GaN substrate, it is desirable to provide the light-emitting structure on the Ga-rich face of the substrate and to render the N-rich face into a roughened face by RIE treatment.

In an m-plane GaN substrate which is a non-polar substrate, there is no distinction between the Ga-rich face and the N-rich face. However, with regard to the susceptibility to RIE treatment, such a substrate appears to have a quality similar to that of the N-polar face of a polar substrate or the N-rich face of a semi-polar substrate. This is because, as with the N-polar face of a polar substrate and the N-rich face of a semi-polar substrate, RIE treatment using the mask pattern shown in FIG. 8 results in the formation of a roughened face on which are densely arrayed protrusions whose sidewalls include a gradual slope.

When an m-plane GaN substrate is RIE treated using the mask pattern shown in FIG. 8, if the etching time is short, the protrusions take on a close-to-cylindrical shape, resulting in the formation of a roughened face having wide intervals between the protrusions. Increasing the etching time changes the shape of the protrusions to one of low symmetry and narrows the intervals between the protrusions. As for the width of the protrusions, the width in the c-axis direction of the GaN substrate becomes larger than the width in the a-axis direction.

FIGS. 10 and 12 show examples of the shapes of protrusions formed on an m-plane GaN substrate by RIE treatment using the mask pattern shown in FIG. 8. In both the example in FIG. 10 (height of protrusions, 1.5 m) and the example in FIG. 12 (height of protrusions, 6 µm), the individual protrusions have shapes that lack rotational symmetry and have sidewall faces whose shapes differ completely on the c+ direction side and the c− direction side. In the example shown in FIG. 12, the slope of the sidewall face on the c− direction side (right side in the diagram) of the protrusion is gradual at the base, but very steep at the top.

The tendency for a topographically uneven surface having gradual slopes on the sidewalls to form when the surface of an m-plane substrate or the N-rich face of a semi-polar substrate is RIE-treated using a mask pattern most likely is due to the nature of the semiconductor surface that is treated and unrelated to the shape and type of etching mask. In other words, this tendency is thought to remain unchanged even when a mask pattern differing from the pattern in FIG. 8 is used or when a random etching mask (a mask on which intentional patterning is not carried out) is used. Examples of random etching masks include the following: (i) a mask which uses a block copolymer having a micro-phase separated structure, (ii) a metal microparticle mask which is formed on the surface to be treated by using the agglomerative effect (balling up) that arises due to surface tension when a metal thin-film (e.g., a gold film or platinum film) is heated, and (iii) a microparticle mask composed of inorganic or organic particles that have been dispersed on the surface to be treated by coating a colloidal dispersion.

(First Variation of Embodiment 1)

Figure 28:
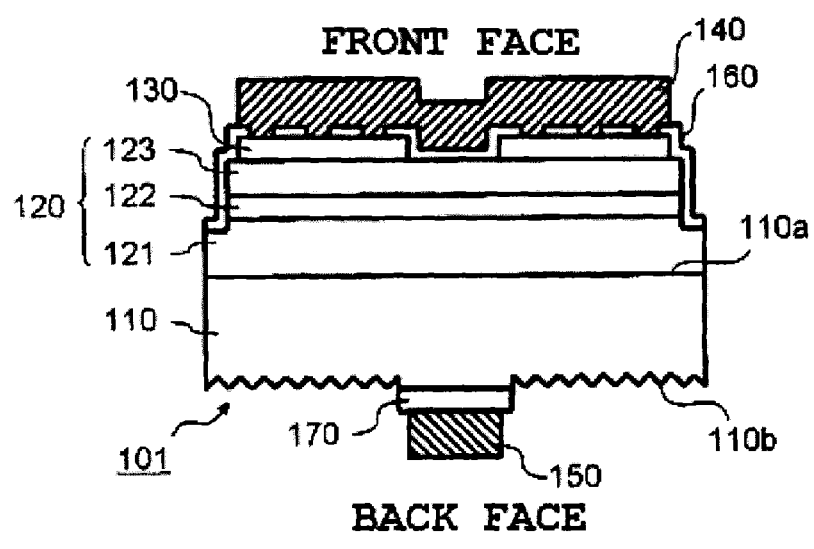
FIG. 28 is a cross-sectional view showing the structure of a nitride LED according to an embodiment of the invention.

FIG. 28 is a cross-sectional diagram of a nitride LED 101 according to a first variation of Embodiment 1. Elements in common with those of the nitride LED 100 according to Embodiment 1 are denoted by the same reference numerals.

The nitride LED 101 has an n-type electrode pad 150 on the back face of a GaN substrate 110. Although not an essential feature, a hafnium-doped film 170, which is a nitride semiconductor thin-film that has been doped with hafnium (Hf) as an n-type impurity, is provided between the GaN substrate 110 and the n-type electrode pad 150 in order to lower the contact resistance. This Hf-doped film 170 is preferably formed of $Al_xGa_{1-x}N$ ($0 \le x \le 0.2$), the hafnium concentration is preferably from $1\times10^{19}$ to $2\times10^{21}$ $cm^{-3}$, and more preferably from $1\times10^{20}$ $cm^{-3}$ to $2\times10^{21}$ $cm^{-3}$, and the thickness is from 1 nm to 5 µm. The Hf-doped film 170 is especially useful when the GaN substrate 110 has a carrier concentration of $5\times10^{17}$ $cm^{-3}$ or less.

The method of forming the Hf-doped film 170 is not particularly limited. Use can be made of metal organic vapor phase epitaxy (MOVPE). Alternatively, advantageous use can be made of pulsed excitation deposition (PXD) processes such as pulsed laser deposition (PLD), pulsed sputtering deposition (PSD) or pulsed electron beam deposition (PED), which are suitable for low-temperature film deposition. Because nitride semiconductor crystals in the form of thin-films can be grown at temperatures of 700° C. or below by a PXD process, following the formation of a light-emitting structure on the front face 110*a* side of a GaN substrate, it is possible to form a Hf-doped film 170 while imparting substantially no thermal damage to the light-emitting structure.

In the nitride LED 101, the Hf-doped film 170 is provided only directly below the n-type electrode pad 150, although it may instead be formed so as to cover the entire back face 110*b* of the GaN substrate. This is because a hafnium-doped nitride semiconductor thin-film, in spite of its high carrier concentration, has a good transparency. By adjusting parameters such as the film-forming temperature, it is possible in this way to grow a Hf-doped film 170 in such a way that the surface spontaneously becomes a roughened plane.

In cases where the GaN substrate 110 has a low carrier concentration, by forming the Hf-doped film 170 to a thickness of at least 0.1 µm, and preferably at least 0.5 µm, over the entire back face 110*b* and having this Hf-doped film 170 function as a conductive path, an electrical current applied to the LED from the n-type electrode pad 150 can be fully diffused in the horizontal direction (the direction orthogonal to the lengthwise direction of the GaN substrate 110).

In the nitride LED 101, to keep an electrical current from being supplied to the active layer 122 in the region directly below the n-type electrode pad 150 when flip-chip mounting is carried out, the translucent electrode 130 provided on the p-type layer 123 has a throughhole in the area corresponding to the n-type electrode pad 150. Also, the p-type electrode pad 140 is formed on a passivation film 160 covering the translucent electrode 130, and is in contact with the translucent electrode 130 by way of throughholes provided in the passivation film 160.

(Second Variation of Embodiment 1)

Figure 29:
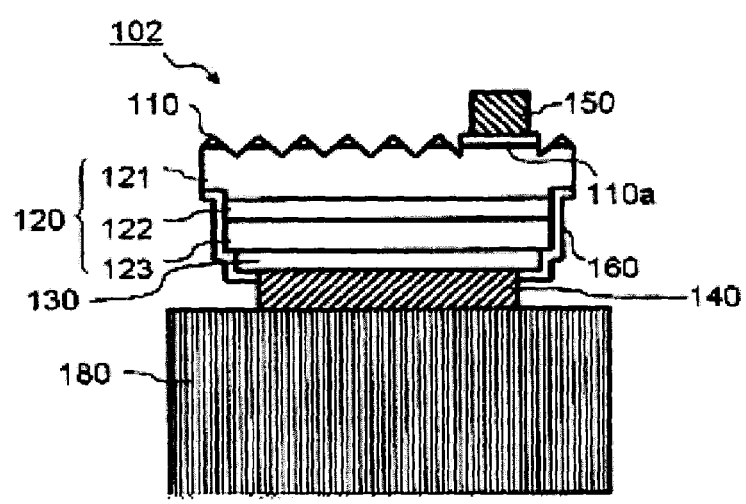
FIG. 29 is a cross-sectional view showing the structure of a nitride LED according to an embodiment of the invention.

FIG. 29 is a cross-sectional diagram of a nitride LED 102 according to a second variation of Embodiment 1. Elements in common with those of the nitride LED 100 according to Embodiment 1 are denoted by the same reference numerals.

The nitride LED 102 has a supporting substrate 180 which is made of metal and bonded to the p-type layer 123 side of a multilayer epitaxial film 120. This supporting substrate 180 is bonded to a p-type electrode pad 140 with an electrically conductive bonding material (not shown). The GaN substrate 110 is a substrate used as a base for growing the multilayer epitaxial film 120.

In the course of producing the nitride LED 102, following growth of the multilayer epitaxial film 120, most of the GaN substrate 110 is removed from the back face side by grinding, followed by lapping. Next, a mask pattern is formed on the back face of the GaN substrate 110 whose thickness has been reduced to several microns by such machining, and roughening is carried out by RIE treatment. If the depth of the depressions formed by such RIE treatment exceeds the thickness of the GaN substrate 110, the n-type layer 121 is exposed at the bottom of these depressions.

The GaN substrate 110 is conferred with n-type conductivity by doping with Si (silicon), O (oxygen), Hf (hafnium) or the like, and an n-type electrode pad 150 is formed on the back face of the partially remaining GaN substrate 110.

(Third Variation of Embodiment 1)

Figure 30:
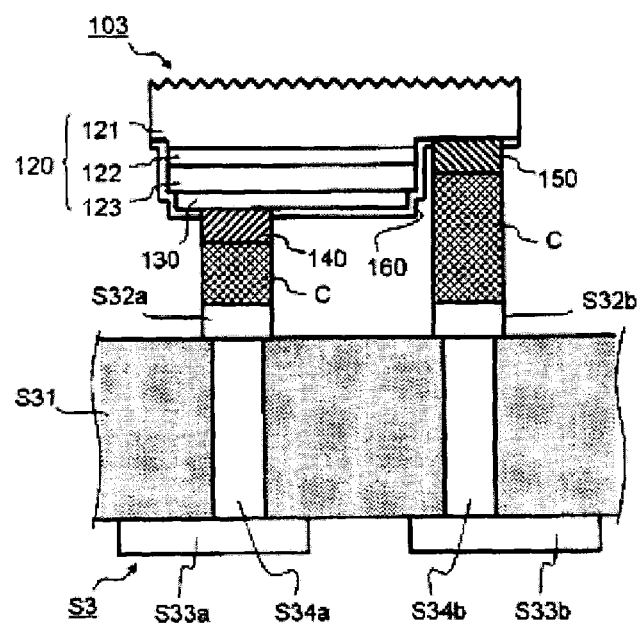
FIG. 30 is a cross-sectional view showing the structure of a light-emitting device in which a nitride LED according to an embodiment of the invention has been flip-chip mounted on a supporting member.

FIG. 30 is a cross-sectional diagram of a light-emitting device in which a nitride LED 103 according to a third variation of Embodiment 1 has been mounted on a supporting member S3. Elements of the nitride LED 103 which are in common with those of the nitride LED 100 according to Embodiment 1 are denoted by the same reference numerals.

The p-type layer 123 side of the multilayer epitaxial film 120 is bonded to a supporting member S3 by an electrically conductive bonding material C. The multilayer epitaxial film 120 was formed by successively growing an n-type layer 121, an active layer 122 and a p-type layer 123 on a sapphire substrate. However, this sapphire substrate is not included in the nitride LED 103. In the course of production, this sapphire substrate is cut from the n-type layer 121 by laser lift-off after the multilayer epitaxial film 120 has been bonded to the supporting member S3. Following lift-off of the sapphire substrate, a mask pattern is formed on the surface of the exposed n-type layer 121 and roughening is carried out by RIE treatment.

(Other Mask Patterns)

In the manufacture of nitride LEDs according to Embodiment 1 and variations thereof, the mask pattern which can be used during roughening of the back face of a GaN substrate or the surface of an n-type layer by RIE treatment is not limited to the mask patterns shown in FIG. 8.

Figure 31:
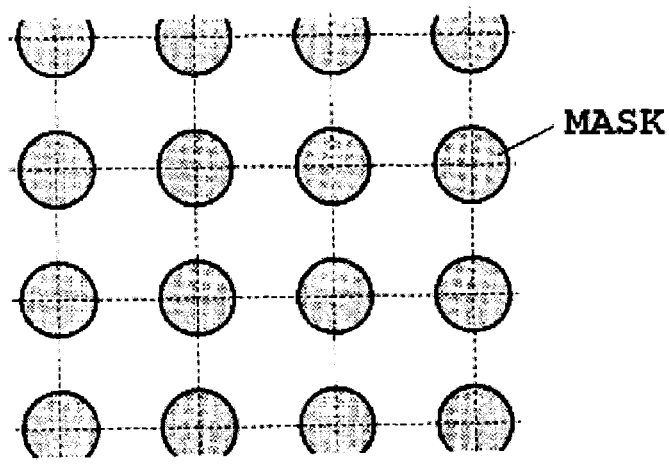
FIG. 31 shows a mask pattern that can be used when roughening a GaN substrate by RIE treatment.

By way of illustration, use can be made of a mask pattern in which the etching masks are arranged at the lattice positions of a square lattice, as shown in FIG. 31. In this case, a topographically uneven surface is formed in which the top points or center of the top planes of the protrusions are located at the lattice positions of a square lattice. Alternatively, although not shown, use may be made of a mask pattern in which the etching masks are located at the lattice positions of a Penrose lattice. In this case, a topographically uneven surface is formed in which the top points or center of the top planes of the protrusions are located at the lattice positions of a Penrose lattice.

Embodiment 2

Generally, when using a nitride LED to construct a light-emitting device, a bonding material is used to mount the nitride LED on a supporting member such as a circuit substrate, an insulating substrate, a leadframe, a ceramic board, a metal board or a metal slug. In cases where a light-emitting device is constructed using a nitride LED 100 according to above Embodiment 1, the back side of the LED may be bonded to the supporting member. However, in a nitride LED 100, because the entire back face 110*b* of the GaN substrate is a roughened face, the GaN substrate and the supporting member do not come into planar contact, and so the bonding strength tends to be low. Also, during bonding, if the back face 110*b* is pushed against the supporting member with too much force, deformation or destruction of the roughened face arises, as a result of which the light-emitting characteristics of the resulting light-emitting device may fluctuate. To resolve these problems, in nitride LEDs according to Embodiment 2, instead of rendering the entire back face of the nitride semiconductor plane into a rough plane, only a portion is roughened.

Figure 2:
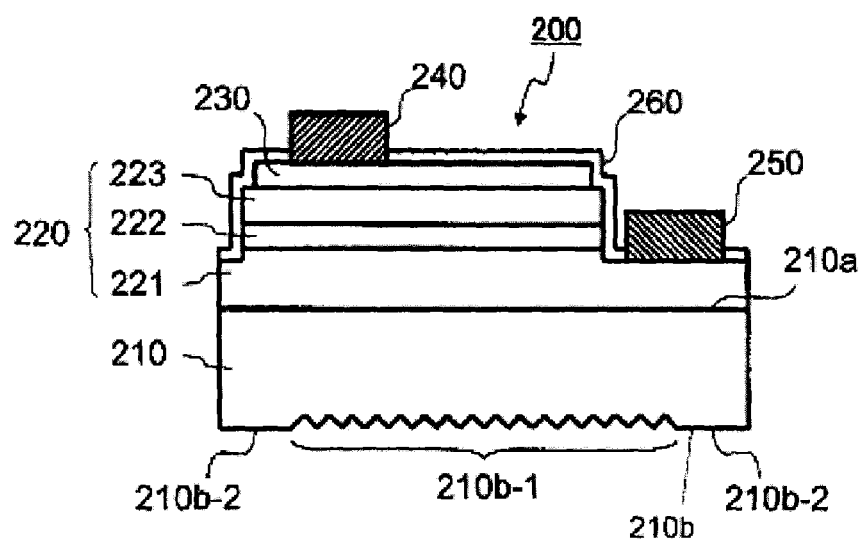
FIG. 2 is a cross-sectional view showing the structure of a nitride LED according to another embodiment of the invention.

FIG. 2 shows the cross-sectional structure of a nitride LED 200 according to Embodiment 2. The nitride LED 200 has, on a front face 210*a* of a GaN substrate 210, a multilayer epitaxial film 220 made of a nitride semiconductor. A roughened region 210*b*-1 and a flat region 210*b*-2 are provided on the back face 210*b* of the GaN substrate. In the roughened region 210*b*-1, the back face of the GaN substrate is roughened by etching treatment. In the flat region 210*b*-2, the back face of the GaN substrate is a face which remains as planarized by lapping and polishing.

The multilayer epitaxial film 220 includes a double hetero p-n junction-type light-emitting structure having an n-type layer 221 and a p-type layer 223 with an active layer 222 therebetween. A translucent electrode 230 composed of a transparent conductive oxide such as ITO is formed on the surface of the p-type layer 223. A p-type electrode pad 240 is formed on part of the translucent electrode 230. An n-type electrode pad 250 is formed on the surface of the n-type layer 221 that is exposed at a site where the p-type layer 223 and the active layer 222 have been partially removed. A passivation film 260 composed of an insulating oxide such as $SiO_2$ covers the surface on the front side of the LED 200, except for the surfaces of the electrode pads.

In the nitride LED 200 manufacturing process, following the planarizing step in which the entire back face of the GaN substrate 210 is subjected to planarizing treatment, a roughening step is carried out in which only a predetermined region is roughened by etching treatment. The region that has been roughened in this roughening step becomes the roughened region 210*b*-1, and the region that remains unroughened becomes the flat region 210*b*-2. The etching treatment method used in the roughening step is suitably selected according to the type of GaN substrate 210 used. In cases where the GaN substrate 210 is a polar substrate (c-plane substrate), both dry etching and wet etching may be used. In cases where the GaN substrate 210 is non-polar or semi-polar, dry etching should be used. The joint use of dry etching and wet etching may be suitably carried out.

The surface of the roughened region 210*b*-1 may be rendered into a roughened face having a plurality of protrusions, as with the back face 110*b* of the GaN substrate in the GaN LED 100 according to above Embodiment 1, or may be rendered into a roughened face having a plurality of depressions or a roughened face having an irregular shape.

By making the height of the protrusions in the roughened face, or the depth of the depressions, similar to or greater than the wavelength within the GaN substrate 210 of the light generated in the active layer 222, this light can be diffused. The height or depth is set to preferably at least 0.5 µm, and more preferably at least 1 µm, with a satisfactory effect being obtained at a height of about 2 µm. At a height or depth greater than this, the light extraction efficiency improving effect does not increase to any great extent.

Instead of providing roughened regions and flat regions directly on the back face 210*b* of the GaN substrate 210, it is also possible to grow a nitride semiconductor layer doped with, for example, hafnium to a high concentration of at least $1 \times 10^{19}$ $cm^{-3}$ and thereby provide the surface of this layer with roughened regions and flat regions. Because a nitride semiconductor crystal having a high concentration of hafnium contains numerous defects, even without using a mask pattern, it is possible to achieve a natural roughened face by wet etching or dry etching the surface.

Figure 3:
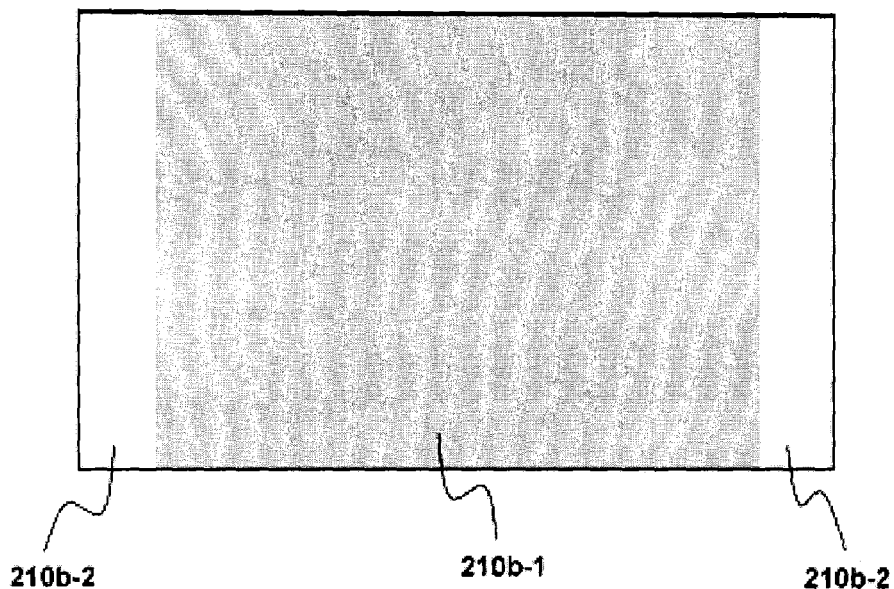
FIG. 3 is a plan view showing the pattern formed by a roughened region and flat regions on the back face of a GaN substrate.

FIG. 3 shows the pattern formed by a roughened region 210*b*-1 and flat regions 210*b*-2 on the back face 210*b* of a GaN substrate. In FIG. 3, the gray area is a roughened region 210*b*-1, and the white areas are flat regions 210*b*-2. The back face 210*b* of the GaN substrate has been given a rectangular shape, and strip-like flat regions 210*b*-2 are provided along each of the two short edges thereof.

Figure 4:
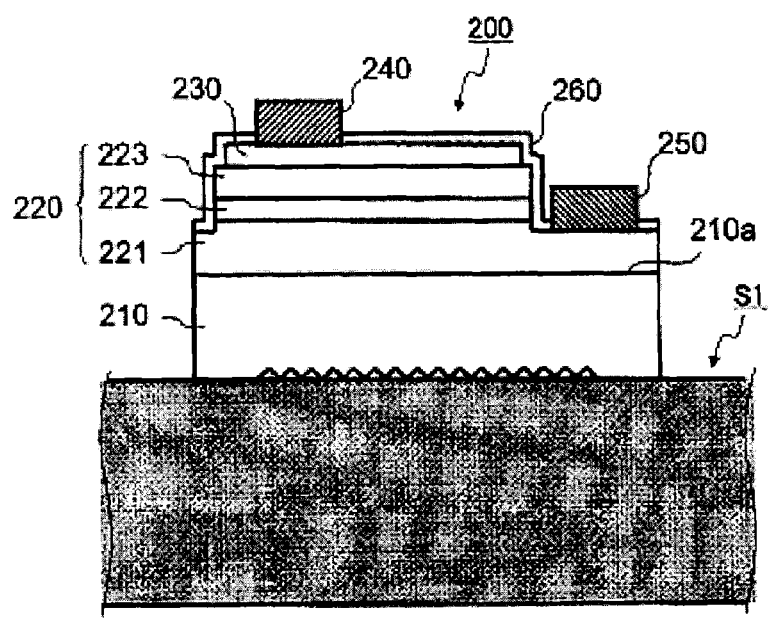
FIG. 4 is a cross-sectional view showing the structure of a light-emitting device according to an embodiment of the invention.

FIG. 4 is a cross-sectional diagram of a light-emitting device having a nitride LED 200 mounted on a supporting member S1. A bonding material (not shown) is present between the back side of the nitride LED 200 and the supporting member S1. A thermoset adhesive based on, for example, an epoxy resin or a silicone resin, such as is commonly employed for die attachment, may be used as the bonding material. As will be understood from the above-described manufacturing process, because the protrusions that have been formed on the roughened region 210b-1 do not project outside the surface of the flat regions 210b-2, the flat regions 210b-2 and the supporting member S1 are in planar contact through the bonding material. Hence, the nitride LED 200 and the supporting member S1 are strongly bonded. Moreover, as described above, because the roughened region 210b-1 is situated between two strip-like flat regions 210b-2, after it has been mounted, the position of the nitride LED 200 is very stable. Also, even if the flat regions 210b-2 are strongly pressed against the supporting member Si, deformation or destruction of the roughened region 210b-1 does not occur.

The pattern formed by the roughened region 210b-1 and the flat region 210b-2 on the back face of the GaN substrate 210 is not limited to that shown in FIG. 3, and may be set as desired. Examples of such patterns are shown in FIGS. 5(a) to 5(d). In FIG. 5(a), the back face of the GaN substrate is rectangular and strip-like flat regions 210b-2 are provided along the two long edges thereof. In FIG. 5(b), the back face of the GaN substrate is square and a flat region 210b-2 which forms a ring along the edges thereof surrounds the roughened region 210b-1. In FIG. 5(c), the back face of the GaN substrate is square and flat regions 210b-2 are provided at each of the four corners. In FIG. 5(d), a plurality of flat regions 210b-2 in the form of dots (in this example, square dots) surrounded thereabout by a roughened region 210b-1 are arranged on the back face of the GaN substrate.

To allow the heat that arises within the multilayer epitaxial film 220 during driving of the nitride LED 200 to effectively escape to the supporting member S1, it is desirable to have the pattern formed by roughened regions and flat regions on the back face of the GaN substrate be the pattern shown in FIG. 5(d), which is a pattern provided with a plurality of dot-like flat regions surrounded thereabout by a roughened region. In this case, the shape and arrangement of the dot-like flat regions is not limited to the example shown in FIG. 5(d), and may be set in various ways. For example, the dot-like flat regions can be given polygonal shapes other than square shapes (such as triangular or hexagonal shapes), or can be made circular or elliptical. Moreover, the plurality of dot-like flat regions shown in FIG. 5(d) are arranged at the lattice positions of a square lattice, but may alternatively be arranged at the lattice positions of a triangular lattice or a hexagonal lattice.

It is desirable for at least the portion of the supporting member S1 on which the nitride LED 200 is mounted to be constructed of a material having a high reflectance. Examples of especially preferred high-reflectance materials include white ceramics, white resins, silver and aluminum. A preferred example of a white ceramic is alumina ceramic. White resins are resins which exhibit a white color and are composed of a transparent base resin filled with a white pigment. Preferred examples of white pigments include alumina powder and titania powder, and preferred examples of the base resin include silicone resins and polyamide resins. The most preferred white resin is a silicone resin filled with an alumina powder. Silver and aluminum are typical examples of metals having high reflectances in the near infrared to visible wavelength range. A surface obtained by mirror-finishing such a metal, then coating the mirror-finished surface with a transparent dielectric thin-film has a high reflectance.

Embodiment 3

Figure 6:
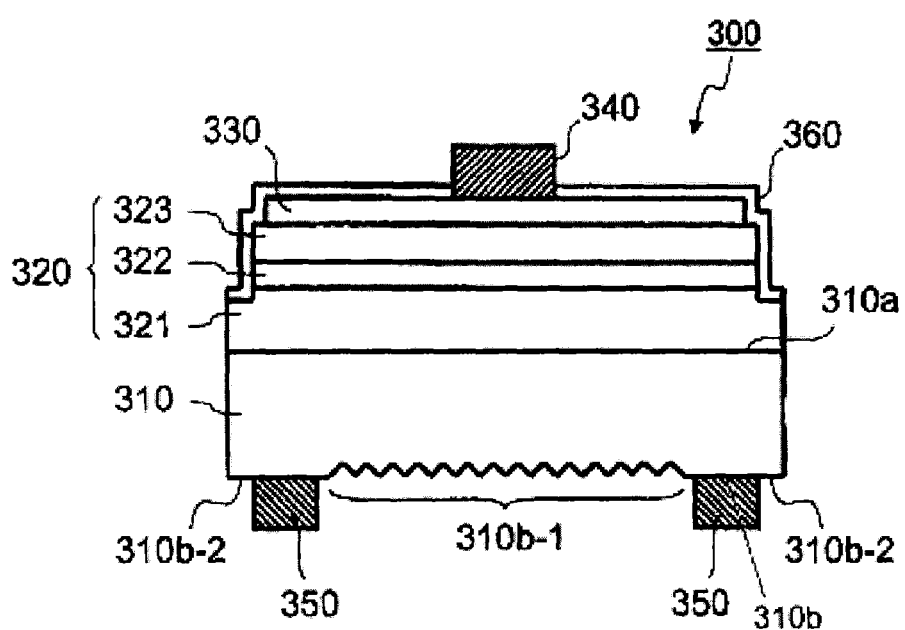
FIG. 6 is a cross-sectional view showing the structure of a nitride LED according to yet another embodiment of the invention.

In the nitride LED according to Embodiment 2 described above, when use is made of a GaN substrate that has been conferred with sufficient n-type conductivity by doping the GaN substrate with silicon, oxygen, hafnium or the like, instead of forming an n-type electrode pad on the surface of the n-type layer included in the epitaxial film, the n-type electrode pad can be formed on the back face of the GaN substrate. FIG. 6 shows the cross-sectional structure of a nitride LED 300 constructed in this way.

The nitride LED 300 has, on the front face 310a of the GaN substrate 310, a multilayer epitaxial film 320 composed of a nitride semiconductor. A roughened region 310b-1 and a flat region 310b-2 are provided on the back face 310b of the GaN substrate. In the roughened region 310b-1, the back face of the GaN substrate has been roughened by etching treatment. In the flat region 310b-2, the back face of the GaN substrate is a face which remains as planarized by lapping and polishing.

The multilayer epitaxial film 320 includes a double hetero p-n junction-type light-emitting structure having an n-type layer 321 and a p-type layer 323 with an active layer 322 therebetween. A translucent electrode 330 composed of a transparent conductive oxide such as ITO is formed on the surface of the p-type layer 323. A p-type electrode pad 340 is formed on part of this translucent electrode 330. An n-type electrode pad 350 is formed on the flat region 310b-2 of the GaN substrate. The n-type electrode pad 350 and the n-type layer 321 are electrically connected via the GaN substrate 310. A passivation film 360 composed of an insulating oxide such as $SiO_2$ covers the surface of the front side of the LED 300, except for the surfaces of electrode pads.

Aside from forming n-type electrode pads 350 on the back face 310b of the GaN substrate, the nitride LED 300 can be manufactured in the same way as the nitride LED 200 according to above-described Embodiment 2. The portion of the n-type electrode pads 350 in contact with the GaN substrate 310 is made of a material which forms an ohmic contact with n-type GaN. Examples of such materials include metals such as Al (aluminum), Cr (chromium), Ti (titanium) and W (tungsten). A transparent conductive oxide film can be interposed between the n-type electrode pad 350 and the GaN substrate 310 in order to decrease the contact resistance. Illustrative examples include conductive oxide films based on an indium oxide such as ITO or IZO (indium zinc oxide), conductive oxide films based on a zinc oxide such as AZO (aluminum zinc oxide) or GZO (gallium zinc oxide), and conductive oxide films based on a tin oxide such as FTO (fluorine-doped tin oxide). Such a conductive oxide film is particularly useful when the carrier concentration of the GaN substrate is $5 \times 10^{17}$ $cm^{-3}$ or less. This conductive oxide film can be replaced with a nitride semiconductor film that has been doped with hafnium to a high concentration of from $1 \times 10^{19}$ to $2 \times 10^{21}$ $cm^{-3}$.

It is preferable to have the surfacemost layer of the n-type electrode pad 350 be a gold layer because connecting materials such as AuSn solder, gold wire and gold bumps are easily bonded to the surface. In addition, it is preferable to interpose a barrier layer containing a metal having a higher melting point than gold between this gold layer and the layer in contact with the GaN substrate 310. Examples of metals that can be advantageously used in the barrier layer include Pt (platinum), Cr (chromium), Ti (titanium) and Ni (nickel).

In this nitride LED 300 as well, the pattern formed on the back face of the GaN substrate by the roughened region 310b-1 and the flat region 310b-2 may be variously set in the same way as in Embodiment 2. In a preferred example, a plurality of dot-like flat regions surrounded thereabout with a roughened region are arranged on the back face of a GaN substrate, and n-type electrode pads are formed on each of these flat regions. It is especially preferable for the dot-like flat regions to be arranged at the lattice positions of triangular lattices. Such a construction enables the density of the current applied from the n-type electrode pads to the active layer through the GaN substrate and the n-type layer to be made uniform within the plane of the active layer.

It is preferable for the surface of the flat region 310b-2 to be finished by polishing. The bottom face of the n-type electrode pads 350 in contact with the flat region 310b-2 thus becomes flat, improving the reflectance, as a result of which the loss of light generated in the active layer 322 due to absorption by the bottom face of the n-type electrode pad can be reduced. In order to improve the reflectance of the n-type electrode pad 350, it is also effective to form the portion that includes the bottom face of the n-type electrode pad of a high-reflectance material. Examples of preferred high-reflectance materials include aluminum, aluminum alloys and transparent conductive oxides.

Figure 7:
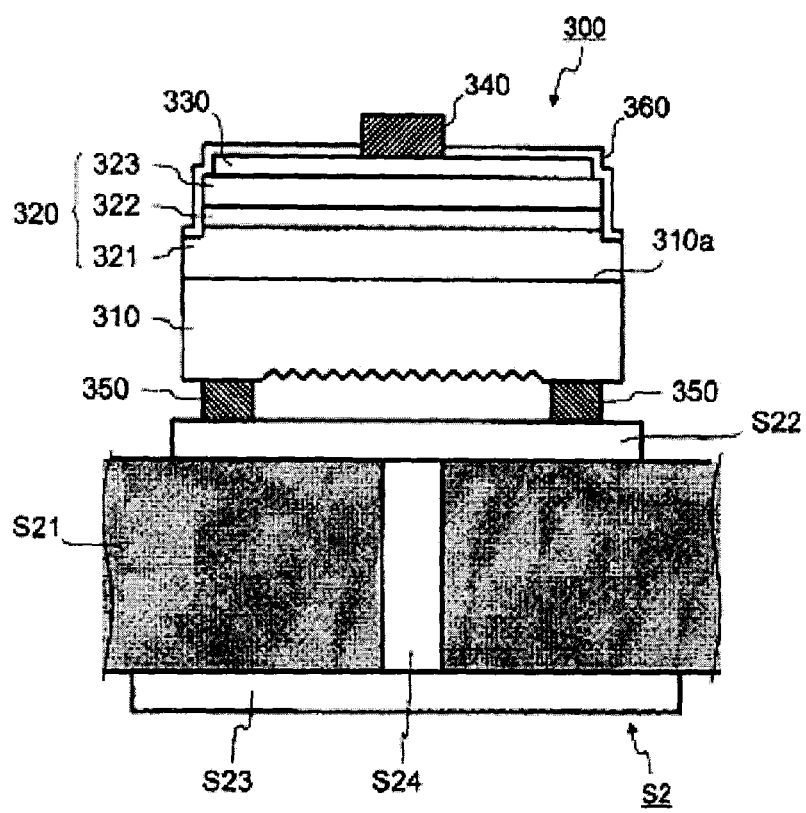
FIG. 7 is a cross-sectional view showing the structure of a light-emitting device according to a further embodiment of the invention.

FIG. 7 is a cross-sectional diagram of a light-emitting device having a nitride LED 300 mounted on a supporting member S2. The supporting member S2 has a ceramic insulating substrate S21, an upper electrode layer S22, a lower electrode layer S23, and a connecting metal portion S24 filled into a via formed in the insulating substrate S21. The upper electrode layer S22 and the lower electrode layer S23 are electrically connected by the connecting metal portion S24. The n-type electrode pad 350 of the nitride LED 300 and the upper electrode layer S22 of the supporting member are bonded by a conductive bonding material (not shown). A solder (e.g., AuSn solder), metal bumps (e.g., gold bumps), a conductive paste (e.g., silver paste), an anisotropically conductive film or the like may be used as the bonding material. Because planar contact is established between the flat region 310b-2 of the back face of the GaN substrate and the surface of the supporting member S2 (surface of the upper electrode layer S22) through the n-type electrode pad 350 and the bonding material (not shown), bonding between the nitride LED 300 and the supporting member S2 is strong. An underfill composed of a transparent resin or a white resin may be filled into the space that forms between the nitride LED 300 and the supporting member S2.

(Experiment 1)

Nitride LEDs having a basic structure similar to that of the nitride LED 100 according to above-described Embodiment 1 were fabricated on a wafer by successively carrying out the three steps of (i) epitaxial growth, (ii) electrode formation and (iii) back face treatment of the GaN substrate, each of which is described below in detail. The emission outputs of the nitride LEDs thus fabricated were evaluated.

(i) Epitaxial Growth

A 330 μm thick m-plane GaN substrate (non-polar substrate) having a surface that was mirror-finished for epitaxial growth was prepared. Using a conventional MOVPE unit, a multilayer epitaxial film which includes a double hetero p-n junction-type light-emitting structure made of a nitride semiconductor was grown on the mirror-finished surface of this m-plane GaN substrate, thereby producing an epiwafer.

Specifically, a 20 nm thick undoped GaN layer, a 1,000 nm thick Si-doped GaN contact layer, a 100 nm thick undoped GaN layer, a 20 nm thick Si-doped GaN layer, an active layer having an MQW structure, a 130 nm thick Mg-doped $Al_{0.18}Ga_{0.82}N$ layer and a 60 nm thick Mg-doped $Al_{0.03}Ga_{0.97}N$ contact layer were grown in this order from the m-plane GaN substrate side. The active layer having an MQW structure was formed by alternately stacking seven GaN barrier layers and six InGaN well layers such that the bottommost layer and the topmost layer were GaN barrier layers. The GaN barrier layers were set to a thickness of 15 nm and the InGaN well layers were set to a thickness of 10 nm. When growing the InGaN well layers, the feed rates of the Group III starting materials TMG (trimethylgallium) and TMI (trimethylindium) were regulated so that the light emission peak wavelength of the LEDs ultimately obtained became about 400 nm.

Activation of the magnesium in the Mg-doped layer was carried out by regulating the flow rates of nitrogen gas and ammonia gas fed into the MOVPE growth furnace as the temperature of the epiwafer is lowered to room temperature after growth of the Mg-doped $Al_{0.03}Ga_{0.97}N$ contact layer, which is the topmost layer of the multilayer epitaxial film, is complete.

(ii) Electrode Formation

In the electrode-forming step, first a translucent electrode composed of an ITO film was formed on the p-type $Al_{0.03}Ga_{0.97}N$ contact layer of the epiwafer obtained in the above epitaxial growth step. This ITO film was formed by electron beam vapor deposition, and was patterned to a predetermined shape using photolithography.

Next, using RIE, the Si-doped GaN contact layer in the areas where n-type electrode pads are to be formed in a subsequent step was exposed. At the same time, in this step, the Si-doped GaN contact layer was exposed at sites on the boundaries between neighboring LEDs on the wafer for the sake of device isolation. The active layer and the p-type layer were cut apart in this way at each LED on the wafer. The size of each LED was set to about 350 μm square.

Following the above RIE step, a p-type electrode pad was formed on the translucent electrode using a lift-off method, concurrent with which an n-type electrode pad was formed on the exposed face of the Si-doped GaN contact layer using a lift-off method. The metal films making up these two electrode pads were formed by using a sputtering process to build up TiW, Au, Pt, Au, Pt, Au, Pt and Au in this order. Following formation of the electrode pads, a lift-off method was used to cover the surface on the front side of the LED, except for the electrode pad surfaces, with a $SiO_2$ film. A plurality of nitride LEDs arranged as a matrix was thereby formed on the wafer.

(iii) Back Face Treatment of GaN Substrate

The wafer obtained in the above electrode-forming step was subjected to roughening treatment of the back face of the m-plane GaN substrate.

In this step, first the front side (epi side of the wafer) of the nitride LED was protected with photoresist, then the back face of the m-plane GaN substrate was subjected to lapping followed by polishing, thereby reducing the thickness of the substrate from 330 μm to 200 μm.

Next, the polished back face of the substrate was coated with a positive working photoresist that uses a novolak resin (Sumiresist PFI-34AL, from SUMITOMO CHEMICAL COMPANY, LIMITED) to a thickness of 1.6 μm, and the photoresist was patterned using photolithography, thereby forming the mask pattern shown in FIG. 8. This mask pattern has a plurality of circular etching masks arranged at the lattice positions of a triangular lattice. The diameter ("R" in FIG. 8) of each circular mask was set to 2 μm, and the spaces ("S" in FIG. 8) between neighboring circular masks were set to 2.5 μm.

Figure 9:
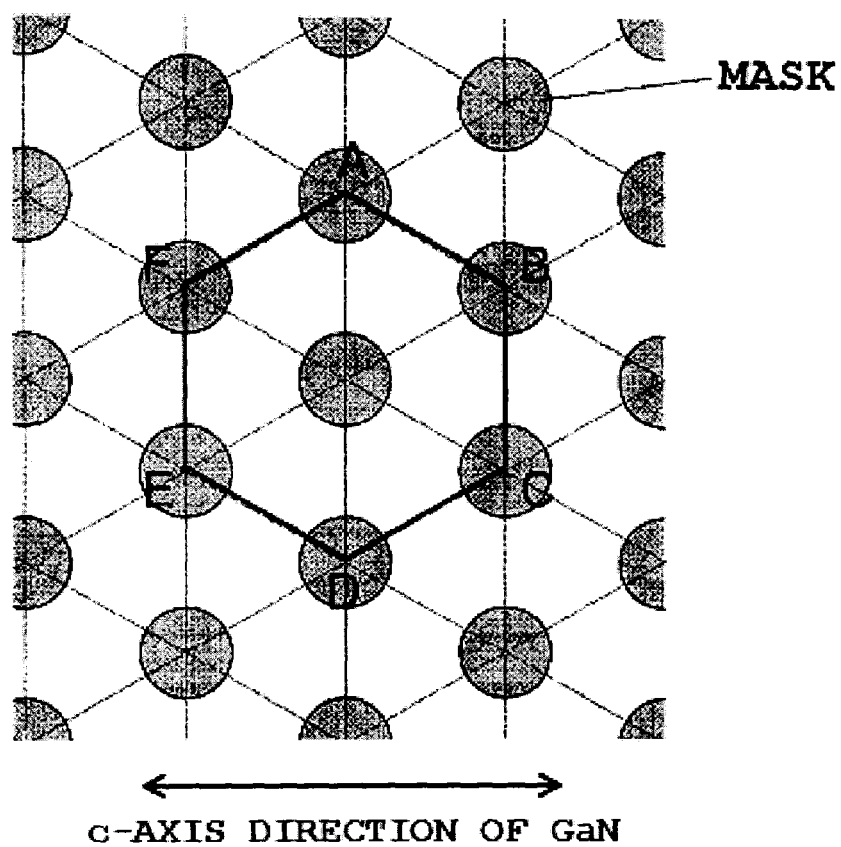
FIG. 9 is a diagram illustrating the direction of the mask pattern.

As shown in FIG. 9, the orientation of the mask pattern was set such that the two sides BC and EF of the regular hexagon ABCDEF in which six lattice positions on a triangular lattice serve as the vertices are perpendicular to the c axis of the m-plane GaN substrate.

The back face of the m-plane GaN substrate was roughened by carrying out RIE treatment using the mask pattern formed as described above. Chlorine was used as the etching gas, the antenna/bias was set to 100 W/20 W, the chamber inside pressure was set to 0.5 Pa, and treatment was carried out so that the etching selectivity was about 1. Here, "etching selectivity" refers to the ratio (GaN etching rate)/(mask etching rate) when the etching time is 800 seconds or less. RIE treatment was carried out for 1,500 seconds under these conditions. When the etching time reached about 800 seconds, the mask pattern substantially disappeared. After RIE treatment, the wafer was cleaned using an organic solvent.

FIGS. 10(a) to 10(c) show SEM images of the back face of the m-plane GaN substrate treated as described above. Here, FIG. 10(a) is a plane view, FIG. 10(b) is a side view, and FIG. 10(c) is a perspective view. In each of FIGS. 10(a) to 10(c), the direction from right to left is the [0001] direction (c+ direction) of GaN, and the direction from left to right is the [000-1] direction (c− direction) of GaN. Also, in FIG. 10(a), the vertical direction is the a-axis direction of GaN. In FIG. 10(a), contrast is provided so that areas having a more gradual slope are darker in color and areas having a steeper slope are lighter in color.

As shown in FIG. 10(a), a pattern in which protrusions are arranged at the lattice positions of a triangular lattice was formed on the back face of a RIE-treated m-plane GaN substrate. The heights of the respective protrusions are 1.5 μm. Each protrusion exhibited a plane-symmetric shape with a plane of symmetry parallel to the a plane of the GaN substrate, although the shape differed greatly between the c+ direction side and the c− direction side. The planar shape could be described as that of an ellipse whose long axis direction is the c-axis direction, with the c− side cut away. As is apparent from FIGS. 10(a) to 10(c), small flat planes exist at the peaks of the protrusions. The sidewall plane on the c-side of these flat planes (the sidewall plane that intersects the plane of symmetry) had a steep slope at the top (the portion associated with the flat plane), whereas the slope from the center downward was gradual. On the other hand, at the respective sidewall planes present on one side and the other side of the plane of symmetry, the slope at the bottom was steeper than the slope at the top. As for the widths of the protrusions, the width in the c-axis direction was larger than the width in the a-axis direction.

The electroluminescence (EL) intensity when a 20 mA current was applied to the LEDs on a wafer manufactured by above steps (i) to (iii) was measured using an autoprobe. The measured EL intensity was compared with the similarly measured EL intensity of the same LEDs at the stage where polishing in step (iii) was complete. As a result, the EL intensity following RIE treatment ($I_{F2}$), as measured from the front side of the LED, had increased 170% from the value before RIE treatment ($I_{F1}$); that is, $(I_{F2}-I_{F1})/I_{F1}=1.7$. Also, the EL intensity following RIE treatment ($I_{B2}$), as measured from the back side of the LED, had increased 120% from the value before RIE treatment ($I_{B1}$); that is, $(I_{B2}-I_{B1})/I_{B1}=1.2$.

In Experiment 1, the reason why asymmetry arose in the shape of the protrusions that formed on the back face of the m-plane GaN substrate is probably due to the following two main factors. First, owing to the asymmetry of the arrangement of atoms in the hexagonal wurtzite-type GaN crystal, the susceptibility of the sidewalls of the protrusions formed on the GaN substrate to chemical action differs on the c+ direction side and the c− direction side. Second, under the RIE conditions used, there arose a relatively strong chemical etching action on the GaN substrate. Due to the combination of these two factors, it is believed that the rate of chemical etching incurred by the protrusion sidewalls exhibited directional dependence, resulting in very different shapes on the c+ direction side of the protrusions versus the c− direction side.

Figure 11A:
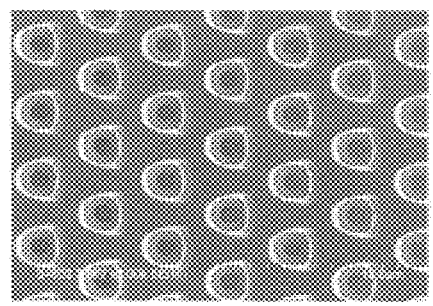
FIG. 11 presents SEM images of a RIE-treated m-plane GaN substrate, with FIG. 11(a) being a top view, FIG. 11(b) being a side view and FIG. 11(c) being a perspective view.
Figure 11B:
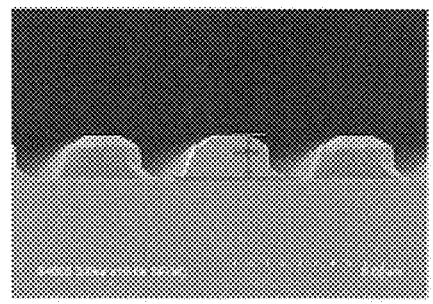
Figure 11C:
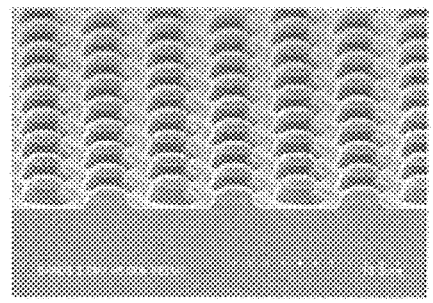

Observational results supporting the above conjecture have been obtained. FIG. 11 presents SEM images of the back face of an m-plane GaN substrate following RIE treatment using the same mask pattern and same RIE conditions as in Experiment 1, with the etching time set to 800 seconds. FIG. 11(a) is a top view, FIG. 11(b) is a side view, and FIG. 11(c) is a perspective view. In each of FIGS. 11(a) to 11(c), the direction from right to left is the c+ direction of GaN, and the direction from left to right is the c− direction of GaN. Also, in FIG. 11(a), the vertical direction is the a-axis direction of GaN. In FIG. 11(a), contrast has been provided so that areas having a more gradual slope are darker in color and areas having a steeper slope are lighter in color.

As shown in FIG. 11(b), the height of the protrusions formed by 800 seconds of RIE treatment was 1.5 which was the same as when the RIE treatment time was 1,500 seconds. However, as is apparent from FIGS. 11(a) and 11(c), the shape of the protrusions when the etching time is short was much closer to that of a cylinder than the shape of the protrusions obtained in Experiment 1. Also, the width of the protrusions in the direction parallel to the c-axis and the width in the direction parallel to the a-axis were about the same. Hence, when attempting to form protrusions having a small shape asymmetry on the back face of an m-plane GaN substrate, it appears to be desirable to use dry etching conditions which result in a weaker chemical etching action.

The change in EL intensity before and after RIE treatment was investigated in the same way as in Experiment 1 for these nitride LEDs in which the RIE treatment time on the back face of the m-plane GaN substrate was set to 800 seconds. As a result, the EL intensity following RIE treatment ($I_{F2}$), as measured from the front side of the LED, had increased 110% from the value before RIE treatment ($I_{F1}$); that is, $(I_{F2}-I_{F1})/I_{F1}=1.1$. Also, the EL intensity following RIE treatment ($I_{B2}$), as measured from the back side of the LED, had increased 90% from the value before RIE treatment ($I_{B1}$); that is, $(I_{B2}-I_{B1})/I_{B1}=0.9$. Although the EL intensity increased due to RIE treatment, the ratio of increase was lower than in LEDs subjected to 1,500 seconds of RIE treatment.

(Experiment 2)

In Experiment 2, aside from adding the following three changes to step (iii), LEDs were fabricated on wafers in the same way as in above Experiment 1.

First, the mask used in RIE treatment was formed of a 1 μm thick $SiO_2$ film instead of a photoresist. Second, this $SiO_2$ mask was patterned so that the spaces ("S" in FIG. 8) between neighboring circular dots were 3.0 μm. Third, the RIE treatment time was set to 3,000 seconds. Although the RIE conditions were the same as in Experiment 1, the etching selectivity was 7. The etching depth was substantially proportional to the treatment time, at least within the treatment time range up to 3,000 seconds. Following RIE treatment, removal of the residual $SiO_2$ mask was not carried out. However, by cleaning the wafer using BHF or the like, this mask can be dissolved and removed.

Figure 12A:
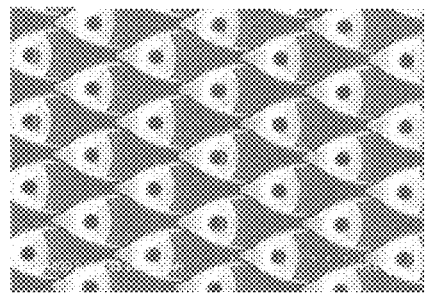
FIG. 12 presents SEM images of a RIE-treated m-plane GaN substrate, with FIG. 12(a) being a top view, FIG. 12(b) being a side view and FIG. 12(c) being a perspective view.
Figure 12B:
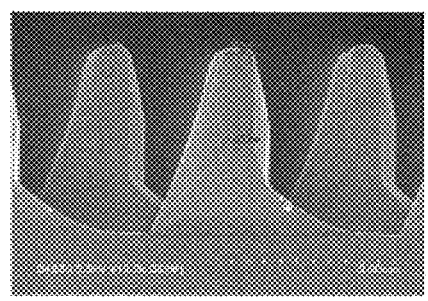
Figure 12C:
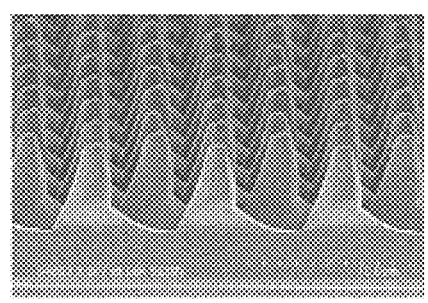

FIG. 12 presents SEM images of the back face of the m-plane GaN substrate of a LED fabricated in Experiment 2. FIG. 12(a) is a plan view, FIG. 12(b) is a side view, and FIG. 12(c) is a perspective view. In each of FIGS. 12(a) to 12(c), the direction from right to left is the c+ direction of GaN, and the direction from left to right is the c− direction of GaN. Also, in FIG. 12(a), the vertical direction is the a-axis direction of GaN. In FIG. 12(a), contrast has been provided so that areas having a more gradual slope are darker in color and areas having a steeper slope are lighter in color.

As shown in FIG. 12(a), on the back face of the m-plane GaN substrate that was RIE treated, a pattern formed in which protrusions were arranged at the lattice positions of a triangular lattice. The height of each protrusion (=etching depth) was 6.0 The individual protrusions had plane-symmetric shapes with a plane of symmetry parallel to the a-plane of the GaN substrate, but the portion on the c+ direction side and the portion on the c− direction side had very different shapes. The dark-colored circular area seen in FIG. 12(a) are the areas where the SiO$_2$ mask remains. As shown in FIGS. 12(a) to 12(c), a gradual sloped plane has formed at the bottom of the sidewall on the c− direction side; aside from this, the sidewall has an overall steep slope. In addition, with regard to the width of the protrusions, as shown in FIG. 12(a), the width in the c-axis direction was larger than the width in the a-axis direction. Moreover, as is apparent from FIG. 12(a), each protrusion was in contact, without intervals therebetween, with at least four other protrusions; that is, each protrusion was tangent to another protrusion located, in this image, on the upper right, lower right, upper left and lower left thereof. Moreover, the intervals between protrusions arrayed laterally in the diagram and the intervals between protrusions arrayed vertically in the diagram were very small.

The EL intensity of the LEDs fabricated in Experiment 2 was measured in the same way as in Experiment 1. The measured EL intensity was compared with the similarly measured EL intensity of the same LEDs at the stage where polishing in step (iii) was complete. As a result, the EL intensity following RIE treatment ($I_{F2}$), as measured from the front side of the LED, had increased 190% from the value before RIE treatment ($I_{F1}$); that is, $(I_{F2}-I_{F1})/I_{F1}=1.9$. Also, the EL intensity following RIE treatment ($I_{B2}$), as measured from the back side of the LED, had increased 190% from the value before RIE treatment ($I_{B1}$); that is, $(I_{B2}-I_{B1})/I_{B1}=1.9$.

Given that the roughened face in FIG. 12 according to the Experiment 2 had protrusions which were four times higher than the protrusions on the roughened face in FIG. 10 according to Experiment 1, the light extraction efficiency improving effect was not all that high.

(Experiment 3)

Nitride LEDs having a basic structure similar to that of the nitride LED 100 in above-described Embodiment 1 were fabricated on a wafer by successively carrying out the three steps of (i) epitaxial growth, (ii) electrode formation, and (iii) back face treatment of the GaN substrate, each of which is described below in detail. The emission output by the nitride LEDs thus fabricated was evaluated.

(i) Epitaxial Growth

A 400 μm thick c-plane GaN substrate (polar substrate) having a surface (c+ plane) that was mirror-finished for epitaxial growth was prepared. Using a conventional MOVPE unit, a multilayer epitaxial film which includes a double hetero p-n junction-type light-emitting structure made of a nitride semiconductor was grown on the mirror-finished surface of this c-plane GaN substrate, thereby producing an epiwafer.

Specifically, a 10 nm thick undoped GaN layer, a 4,000 nm thick Si-doped GaN contact layer, a 200 nm thick undoped GaN layer, a 20 nm thick Si-doped GaN layer, an active layer having an MQW structure, a 130 nm thick Mg-doped Al$_{0.09}$Ga$_{0.91}$N layer and a 60 nm thick Mg-doped Al$_{0.03}$Ga$_{0.97}$N contact layer were grown in this order from the c-plane GaN substrate side. The active layer having an MQW structure was formed by alternately stacking seven GaN barrier layers and six InGaN well layers such that the bottommost layer and the topmost layer were GaN barrier layers. The GaN barrier layers were set to a thickness of 15 nm and the InGaN well layers were set to a thickness of 2.3 nm. When growing the InGaN well layers, the feed rates of the Group III starting materials trimethylgallium (TMG) and trimethylindium (TMI) were regulated so that the light emission peak wavelength of the LEDs ultimately obtained became about 440 nm. Activation of the magnesium in the Mg-doped layer was carried out in the same way as in Experiment 1.

(ii) Electrode Formation

In the electrode-forming step, first a translucent electrode composed of an ITO film was formed on the p-type Al$_{0.03}$Ga$_{0.97}$N contact layer of the epiwafer obtained in the above epitaxial growth step. This ITO film was formed by electron beam vapor deposition, and was patterned to a predetermined shape using photolithography.

Next, using RIE, the Si-doped GaN contact layer in the areas where n-type electrode pads are to be formed in a subsequent step was exposed. At the same time, in this step, the Si-doped GaN contact layer was exposed at sites on the boundaries between neighboring LEDs on the wafer for the sake of device isolation. The active layer and the p-type layer were cut apart in this way at each LED on the wafer. The size of the each LED was set to about 350 μm square.

Following the above RIE step, an aluminum layer was formed, as the bottommost layer of the n-type electrode pad, on the exposed face of the Si-doped GaN contact layer using a lift-off method. This aluminum layer was heat-treated, following which, concurrent with formation of a p-type electrode pad on the translucent electrode using a lift-off method, the same metal films as those making up the p-type electrode pad were stacked on top of the aluminum layer. The metal films making up the p-type electrode pad were formed by using a sputtering process to build up TiW, Au, Pt, Au, Pt, Au, Pt and Au in this order. Following formation of the two electrode pads in this way, a lift-off method was used to cover the surface on the front side of the LED, except for the electrode pad surfaces, with a SiO$_2$ film. A plurality of nitride LEDs arranged as a matrix was thereby formed on the wafer.

(iii) Back Face Treatment of GaN Substrate

The wafer obtained in the above electrode-forming step was subjected to roughening treatment of the back face (c-plane) of the c-plane GaN substrate.

In this step, first the front side of the nitride LED was protected with photoresist, then the back face of the c-plane GaN substrate was subjected to lapping followed by polishing, thereby reducing the thickness of the substrate from 400 μm to 200 μm.

Next, the polished back face of the substrate was coated with a positive working photoresist that uses a novolak resin (Sumiresist PFI-34AL, from SUMITOMO CHEMICAL COMPANY, LIMITED) to a thickness of 1.6 μm, and the photoresist was patterned using photolithography, thereby forming the mask pattern shown in FIG. 8. This mask pattern has a plurality of circular etching masks arranged at the lattice positions of a triangular lattice. The diameter ("R" in FIG. 8) of each circular mask was set to 2 μm, and the spaces ("S" in FIG. 8) between neighboring circular masks were set to 2.5 μm. The orientation of the mask pattern was set such that two sides of a regular hexagon whose vertices are six lattice positions of a triangular lattice are perpendicular to the m-axis of GaN.

The back face of the c-plane GaN substrate was roughened by carrying out RIE treatment using the mask pattern formed as described above. Chlorine was used as the etching gas, the antenna/bias was set to 100 W/20 W, the chamber inside pressure was set to 0.5 Pa, and treatment was carried out so that the etching selectivity was about 1.2. Here, "etching selectivity" refers to the ratio (GaN etching rate)/(mask etching rate) when the etching time is 1,000 seconds or less. RIE treatment was carried out for 1,000 seconds under these conditions. When the etching time reached about 1,000 seconds, the mask pattern substantially disappeared. After RIE treatment, the wafer was cleaned using an organic solvent.

FIGS. 13(a) to 13(c) show SEM images of the back face of the c-plane GaN substrate treated as described above. Here, FIG. 13(a) is a plane view, FIG. 13(b) is a side view, and FIG. 13(c) is a perspective view. In FIGS. 13(a) and 13(c), the direction from right to left is the m direction of GaN. Also, in FIG. 13(a), the vertical direction is the a-axis direction of GaN. In FIG. 13(a), contrast has been provided so that areas having a more gradual slope are darker in color and areas having a steeper slope are lighter in color.

As shown in FIG. 13(a), a pattern in which protrusions are arranged at the lattice positions of a triangular lattice was formed on the back face of a c-plane GaN substrate. The heights of the respective protrusions were 2.0 µm. As shown in FIGS. 13(a) to 13(c), the protrusions were shaped as truncated cones, each having at the top of the sidewall (the portion that intersects with the top face) a portion which was gradually sloped, with the slope from the center of the sidewall downward being of steeper slope than the top. As is apparent from FIG. 13(a), because there were no intervals between the protrusions, the peripheral shape of each protrusion, in a top view of the roughened face, was that of a regular hexagon.

The EL intensity of the LEDs fabricated in Experiment 3 was measured in the same way as in Experiment 1, and the measured EL intensity was compared with the similarly measured EL intensity of the same LEDs at the stage where polishing in step (iii) was complete. As a result, the EL intensity following RIE treatment ($I_{F2}$), as measured from the front side of the LED, had increased 170% from the value before RIE treatment ($I_{F1}$); that is, $(I_{F2}-I_{F1})/I_{F1}=1.7$. Also, the EL intensity following RIE treatment ($I_{B2}$), as measured from the back side of the LED, had increased 320% from the value before RIE treatment ($I_{B1}$); that is, $(I_{B2}-I_{B1})/I_{B1}=3.2$. This result suggests that the reflectance of the back face of the GaN substrate to light entering from the inner side of the LED decreased considerably due to RIE treatment.

Given that the height of the protrusions on the roughened face in FIG. 13 according to Experiment 3 is one-third that of the protrusions on the roughened face in FIG. 12 according to Experiment 2, the light extraction efficiency improving effect appears to be excellent.

(Experiment 4)

In Experiment 4, aside from adding the following three changes to step (iii), LEDs were fabricated on wafers in the same way as in above Experiment 3.

First, the mask used in RIE treatment was formed of a 1 µm thick $SiO_2$ film instead of a photoresist. Second, this $SiO_2$ mask was patterned so that the spaces ("S" in FIG. 8) between neighboring circular dots were 3.0 µm. Third, the RIE treatment time was set to 3,000 seconds. Although the RIE conditions were the same as in Experiment 1, the etching selectivity was about 7. The etching depth was substantially proportional to the treatment time, at least within the treatment time range up to 3,000 seconds. Following RIE treatment, removal of the residual $SiO_2$ mask was not carried out. However, by cleaning the wafer using BHF or the like, this mask can be dissolved and removed.

FIG. 14 presents SEM images of the back face of the c-plane GaN substrate of a LED fabricated in Experiment 4. FIG. 14(a) is a plan view, FIG. 14(b) is a side view, and FIG. 14(c) is a perspective view. In each of FIGS. 14(a) to 14(c), the left-right direction is the m-axis direction of GaN. Also, in FIG. 14(a), the vertical direction is the a-axis direction of GaN. In FIG. 14(a), contrast has been provided so that areas having a more gradual slope are darker in color and areas having a steeper slope are lighter in color.

As shown in FIG. 14(a), on the back face of the c-plane GaN substrate, a pattern had formed in which protrusions were arranged at the lattice positions of a triangular lattice. The height (=etching depth) of each protrusion was 5.9 µm. As shown in FIGS. 14(a) to 14(c), the protrusions were shaped as truncated cones having a narrow top face, and were indeed nearly cones. Moreover, as is apparent from FIG. 14(a), no intervals were present between the protrusions. Hence, in a top view of the roughened face, each of the protrusions had a peripheral shape that was a regular hexagonal.

The EL intensity of the LEDs fabricated in Experiment 4 was measured in the same way as in Experiment 1. The measured EL intensity was compared with the similarly measured EL intensity of the same LEDs at the stage where polishing in step (iii) was complete. As a result, the EL intensity following RIE treatment ($I_{F2}$), as measured from the front side of the LED, had increased 180% from the value before RIE treatment ($I_{F1}$); that is, $(I_{F2}-I_{F1})/I_{F1}=1.8$. Also, the EL intensity following RIE treatment ($I_{B2}$), as measured from the back side of the LED, had increased 540% from the value before RIE treatment ($I_{B1}$); that is, $(I_{B2}-I_{B1})/I_{B1}=5.4$.

Taking into consideration the fact that, in above Experiment 2 in which the height of the protrusions was the same, the increase due to RIE treatment in the EL intensity measured from the back side of the LED was 190%, the high value of 540% obtained here in Experiment 4 is surprising.

(Experiment 5)

The orientation of the mask pattern in step (iii) of Experiment 1 was set, as shown in FIG. 9, such that the two sides BC and EF of a regular hexagon ABCDEF having vertices at six lattice positions on a triangular lattice are perpendicular to the c-axis of the m-plane GaN substrate. By contrast, in Experiment 5, the orientation of the mask pattern was rotated 30 degrees so that two sides of the regular hexagon having vertices at six lattice positions on a triangular lattice were parallel to the c-axis of the m-plane GaN substrate. Aside from this, nitride LEDs in which the back face of the m-plane GaN substrate was RIE treated were fabricated in the same way as in Experiment 1.

Figures 21, 21A, 21B, 21C:
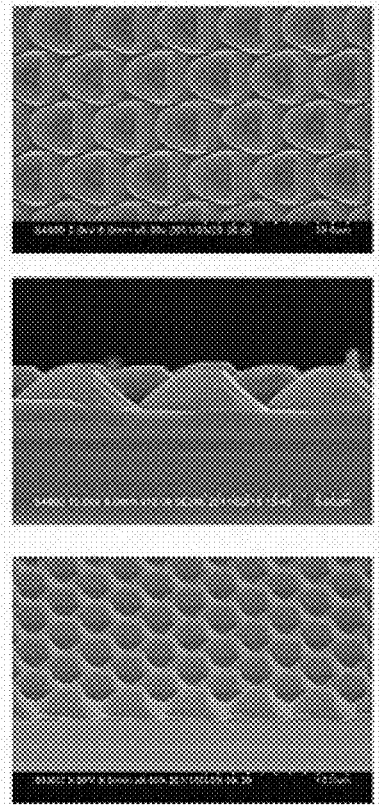
FIGS. 21(a)-21(c) present SEM images of a RIE-treated m-plane GaN substrate, FIG. 21(a) being a top view, FIG. 21(b) being a side view and FIG. 21(c) being a perspective view.

FIG. 21 presents SEM images of the back face of a RIE-treated m-plane GaN substrate. FIG. 21(a) is a top view, FIG. 21(b) is a side view, and FIG. 21(c) is a perspective view. As is apparent from these SEM images, the protrusions were each located at lattice positions on a triangular lattice, and the height of each protrusion was 1.5 µm. Even though the orientation of the mask pattern differed from that in Experiment 1, the shapes of the individual protrusions had the same characteristics as in Experiment 1. That is, each protrusion exhibited a planar symmetrical shape having a plane of symmetry parallel to the a plane of the GaN substrate, yet the shape of each protrusion was very different on the c-direction side and on the c+ direction side. This result does not contradict the above-mentioned conjecture relating to the mechanism by which asymmetry in the protrusion shape arises.

The ratio of increase in the EL intensity after RIE treatment ($I_2$) relative to the EL intensity before RIE treatment ($I_1$), which is defined as $(I_2-I_1)/(I_1)$, was substantially the same as in Experiment 1, both when measurement was carried out from the front side of the LED and when measurement was carried out from the back side of the LED.

(Experiment 6)

The orientation of the mask pattern in step (iii) of Experiment 2 was set, as shown in FIG. 9, such that the two sides BC and EF of a regular hexagon ABCDEF having vertices at six lattice positions on a triangular lattice are perpendicular to the c-axis of the m-plane GaN substrate. By contrast, in Experiment 6, the orientation of the mask pattern was rotated 30 degrees so that two sides of the regular hexagon having vertices at six lattice positions on a triangular lattice were parallel with the c-axis of the m-plane GaN substrate. Aside from this, nitride LEDs in which the back face of the m-plane GaN substrate was RIE treated were fabricated in the same way as in Experiment 2.

Figure 22A:
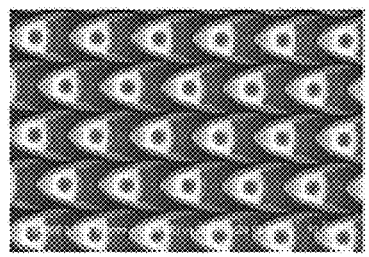
FIG. 22 presents SEM images of a RIE-treated m-plane GaN substrate, with FIG. 22(a) being a top view, FIG. 22(b) being a side view and FIG. 22(c) being a perspective view.
Figure 22B:
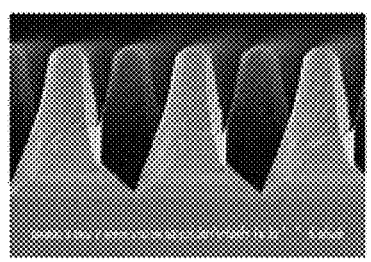
Figure 22C:
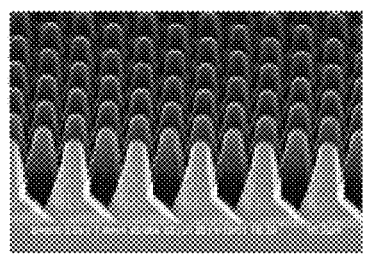

FIG. 22 presents SEM images of the back face of a RIE-treated m-plane GaN substrate. FIG. 22(a) is a top view, FIG. 22(b) is a side view, and FIG. 22(c) is a perspective view. As is apparent from these SEM images, the protrusions were each located at lattice positions on a triangular lattice, and the height of each protrusion was 6.5 μm. Even though the orientation of the mask pattern differed from that in Experiment 2, the shapes of the individual protrusion had the same characteristics as in Experiment 2. That is, each protrusion exhibited a planar symmetrical shape having a plane of symmetry parallel to the a plane of the GaN substrate, yet the shape of each protrusion was very different on the c-direction side and on the c+ direction side.

(Experiment 7)

In Experiment 7, a nitride LED was fabricated using a semi-polar (20-21) plane GaN substrate. An epitaxial film containing a light-emitting structure was grown on the (20-21) plane (nitrogen-rich face), and the (20-2-1) plane (gallium-rich face) was RIE treated. The etching mask (made of photoresist) and the RIE conditions (including the etching time) used were the same as in Experiment 1. The orientation of the mask pattern was set such that two sides of a regular hexagon whose vertices are six lattice positions on a triangular lattice were perpendicular to the c-axis of the (20-21) plane GaN substrate.

Figure 32A:
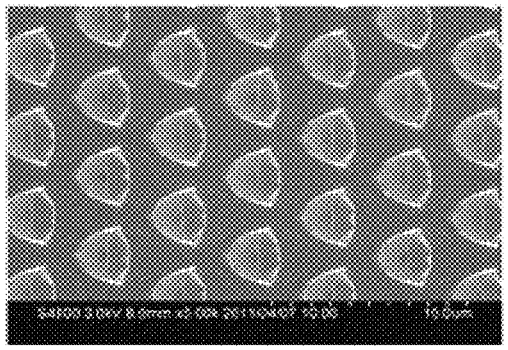
FIG. 32 presents SEM images of the Ga-rich face of a RIE-treated semi-polar (20-21) GaN substrate, FIG. 32(a) being a top view and FIG. 32(b) being a perspective view.
Figure 32B:
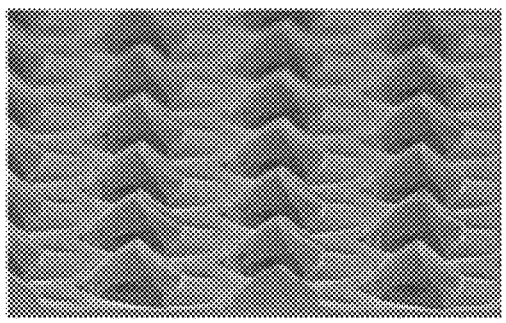

FIG. 32 shows SEM images of the back face of a GaN substrate following RIE treatment. FIG. 32(a) is a plan view and FIG. 32(b) is a perspective view. Each of the protrusions had a height of 15 μm.

Upon investigating the change in EL intensity before and after RIE treatment in the same way as in Experiment 1, the EL intensity after RIE treatment ($I_{F2}$), as measured from the front side of the LED, had increased 50% relative to the value before RIE treatment ($I_{F1}$); that is, $(I_{F2}-I_{F1})/I_{F1}=0.5$. Also, the EL intensity after RIE treatment ($I_{B2}$), as measured from the back side of the LED, had increased 30% relative to the value before RIE treatment ($I_{B1}$); that is, $(I_{B2}-I_{B1})/I_{B1}=0.3$. Although the EL intensity due to RIE treatment does increase, the ratio of increase is much smaller than that obtained in Experiment 1.

(Experiment 8)

In Experiment 8, a nitride LED was fabricated using a semi-polar (20-21) plane GaN substrate. An epitaxial film containing a light-emitting structure was grown on the (20-2-1) plane (gallium-rich face), and the (20-21) plane (nitrogen-rich face) was RIE treated. The etching mask (made of photoresist) and the RIE conditions (including the etching time) used were the same as in Experiment 1. The orientation of the mask pattern was set such that two sides of a regular hexagon whose vertices are six lattice positions on a triangular lattice were perpendicular to the a-axis of the (20-21) plane GaN substrate.

Figure 23:
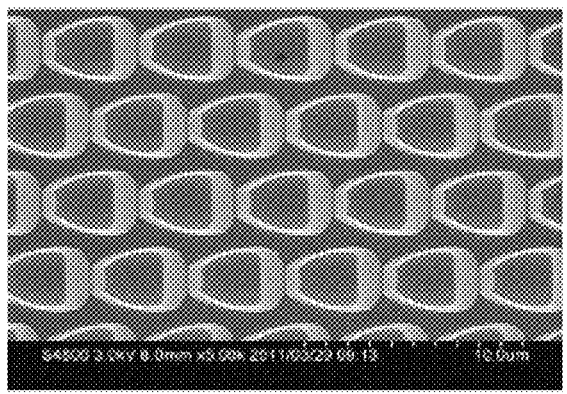
FIG. 23 presents a SEM image (top view) of the N-rich face of a RIE-treated semi-polar (20-21) GaN substrate.

FIG. 23 shows a SEM image (top view) of the (20-21) plane after RIE treatment. The respective protrusions were located at lattice positions on a triangular lattice, and each protrusion had a height of about 1.7 μm. Each protrusion exhibited a planar symmetrical shape having a plane of symmetry parallel to the a plane of the GaN substrate, yet the shape of each protrusion was very different on the c-direction side and on the c+ direction side. Also, the individual protrusions did not include a gradual sloped face on the side walls; any one protrusion had only two other protrusions adjacent thereto without an interval therebetween.

(Experiment 9)

In Experiment 9, a nitride LED was fabricated using a semi-polar (20-21) plane GaN substrate. An epitaxial film containing a light-emitting structure was grown on the (20-2-1) plane (gallium-rich face), and the (20-21) plane (nitrogen-rich face) was RIE treated. The etching mask and the RIE conditions (including the etching time) used were the same as in Experiment 2. The orientation of the mask pattern was set such that two sides of a regular hexagon whose vertices are six lattice positions on a triangular lattice were perpendicular to the c-axis of the (20-21) plane GaN substrate.

FIG. 16 shows SEM images of the back face of the GaN substrate after RIE treatment. FIG. 16(a) is a top view and FIG. 16(b) is a perspective view. As is apparent from these SEM images, the respective protrusions were located at lattice positions on a triangular lattice, and each protrusion had a height of about 6 μm. Each protrusion exhibited a planar symmetrical shape having a plane of symmetry parallel to the a plane of the GaN substrate, yet the shape of each protrusion was very different on the c– direction side and on the c+ direction side.

(Experiment 10)

In Experiment 10, aside from growing an epitaxial film containing a light-emitting structure on the (20-21) plane (nitrogen-rich face) and RIE treating the (20-2-1) plane (gallium-rich face), a nitride LED was fabricated in the same way as in Experiment 9.

FIG. 17 shows a SEM image (perspective view) of the back face of a GaN substrate following RIE treatment.

Upon investigating the change in EL intensity before and after RIE treatment in the same way as in Experiment 2, the EL intensity after RIE treatment, as measured from the front side of the LED ($I_{F2}$), had increased 30% relative to the value before RIE treatment ($I_{F1}$); that is, $(I_{F2}-I_{F1})/I_{F1}=0.3$. Also, the EL intensity after RIE treatment, as measured from the back side of the LED ($I_{B2}$), had increased 40% relative to the value before RIE treatment ($I_{B1}$); that is, $(I_{B2}-I_{B1})/I_{B1}=0.4$. It can be concluded from this that, although the EL intensity due to RIE treatment does increase, the ratio of increase is much smaller than that obtained in Experiment 2.

(Experiment 11)

In Experiment 11, a nitride LED was fabricated using a semi-polar (10-11) plane GaN substrate. An epitaxial film containing a light-emitting structure was grown on the (10-1-1) plane (gallium-rich face), and the (10-11) plane (nitrogen-rich face) was RIE treated. The etching mask and the RIE conditions (including the etching time) used were the same as in Experiment 2. The orientation of the mask pattern was set such that two sides of a regular hexagon whose vertices are six lattice positions on a triangular lattice were perpendicular to the c-axis of the (20-21) plane GaN substrate.

FIG. 27 shows SEM images of the back face of the GaN substrate after RIE treatment. FIG. 27(a) is a top view, and FIG. 27(b) is a perspective view. As is apparent from these SEM images, the respective protrusions were located at lattice positions on a triangular lattice, and each protrusion had a height of about 6 μm. Each protrusion exhibited a planar symmetrical shape having a plane of symmetry parallel to the a plane of the GaN substrate, yet the shape of each protrusion is very different on the c– direction side and on the c+ direction side.

(Experiment 12)

In Experiment 12, aside from growing an epitaxial film containing a light-emitting structure on the (10-11) plane (nitrogen-rich face) and RIE treating the (10-1-1) plane (gallium-rich face), a nitride LED was fabricated in the same way as in Experiment 11.

FIG. 18 shows a SEM image (perspective view) of the GaN substrate after RIE treatment.

(Simulation)

A simulation was used to determine which, of the roughened face obtained by RIE treatment of the c− plane of a c-plane GaN substrate (FIG. 14) and the roughened face obtained by RIE treatment of the c+ plane (FIG. 15), has the higher light extraction efficiency-improving effect. Details on and results from the simulation are given below.

Figure 19:
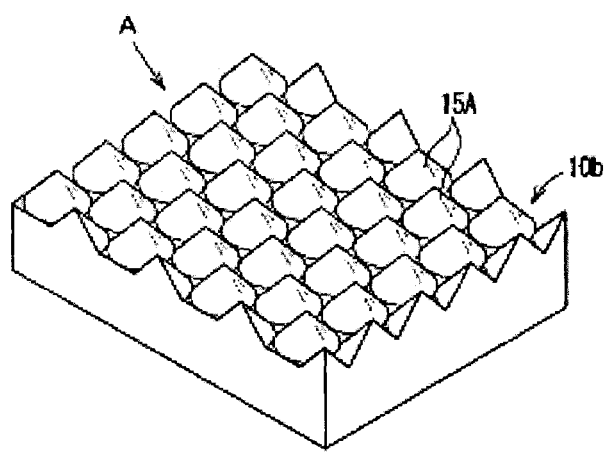
FIG. 19 is a perspective view showing a roughened face A in a simulation.
Figure 20:
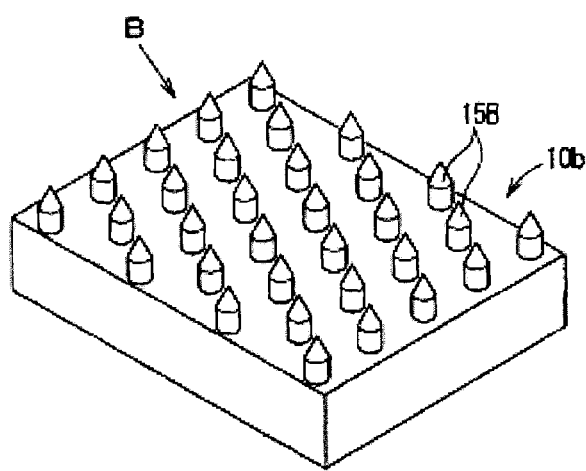
FIG. 20 is a perspective view showing a roughened face B in a simulation.

In this simulation, the light extraction efficiency and the axial radiant flux when, in the nitride LED 100 shown in FIG. 1, the back face of the GaN substrate 110 is Roughened Face A shown in FIG. 19 and when it is Roughened Face B shown in FIG. 20 were compared.

Roughened Face A (FIG. 19) and Roughened Face B (FIG. 20) each have a plurality of protrusions located at lattice positions on a triangular lattice, with the pitch of the triangular lattice (4.5 μm) and the height of the protrusions (5.7 μm) being the same. What differs is the shape of the protrusions. On Roughened Face A, the protrusions 15A are conical, whereas on Roughened Face B, the protrusions 15B are shaped as cylinders with conically sharpened tips.

The diameter of the base of each protrusion 15A on Roughened Face A is the same as the pitch of the triangular lattice. That is, the plurality of protrusions 15A is arranged so that six surrounding protrusions are in contact with any single protrusion.

On the other hand, on Roughened Face B, each of the plurality of protrusions 15B has a given interval between itself and six surrounding protrusions. In the simulation, the base of each protrusion 15B (base of the cylindrical portion) was set to a diameter of 3.0 μm, and the conical portion on the tip side of each protrusion was set to a height of 2.7 μm.

Other conditions of the simulation were set as follows.

The emission wavelength of the nitride LED 100 was set to 405 nm. The GaN substrate 110 was given a refractive index of 2.53, the size was set to 350 μm×350 μm (L×W), and the thickness was set to 100 μm. The thickness of the multilayer epitaxial film 120 was set to 10 μm. For the sake of convenience, the interior of the multilayer epitaxial film 120 was assumed to be optically uniform, and the refractive index was made the same as that of the GaN substrate 110. The GaN substrate 110 and the multilayer epitaxial film 120 were each given an extinction coefficient of $1\times10^{-7}$. The translucent electrode 130 formed of ITO was set to a refractive index of 2.0, an extinction coefficient of 0.02 and a surface area of 58,656 μm². The p-type electrode pad 140 and the n-type electrode pad 150 were both set to a diameter of 100 μm, a refractive index of 1.5 and an extinction coefficient of 1.88. In setting the refractive index and the extinction coefficient here, reference was made to the values for gold. For the sake of simplicity, the passivation film 160 was omitted. Except for the back face of the GaN substrate 110, the surface of the nitride LED 100 was assumed to be a smooth optical surface.

In the simulation, the nitride LED 100 was packaged on a flat diffuse reflector having a reflectance of 80% in such a way that the electrode pads 140 and 150 are in contact with the surface of the diffuse reflector; that is, in a flip-chip mounted state. The medium surrounding the nitride LED 100 was assumed to be a medium having a reflectance of 1.

Simulation was carried out by a ray-tracing algorithm using LightTools®, which is illumination design and analysis software from Optical Research Associations (currently Synopsis, Inc.). The ratio of light energy that escapes into the outside medium from the interior of the nitride LED 100 relative to the light energy issuing from the light-emitting layer 122 was calculated as the light extraction efficiency. The light energy emitted within a given range in angle centered on the axial direction (the direction of the normal to the back face of the GaN substrate 110, which was regarded as a flat plane parallel to the light-emitting layer 122) was calculated as the axial radiant flux.

The results of the simulation are shown in Table 1. Both the light extraction efficiency and the axial radiant flux are shown as relative values based on a value of 1 when the back face of the GaN substrate 110 is Roughened Face B.

TABLE 1

|  | Light extraction efficiency | Axial radiant flux | | |
| --- | --- | --- | --- | --- |
|  |  | ±30° | ±20° | ±10° |
| Roughened Face A | 1.08 | 2.0 | 2.5 | 3.0 |
| Roughened Face B | 1 | 1 | 1 | 1 |

The three axial radiant fluxes for ±30°, ±20° and ±10° are shown in Table 1. These respectively indicate the values when it is assumed that only light rays emitted within ranges of 30°, 20° and 10° of the direction of the normal to the back face of the GaN substrate 110, which is treated as a flat plane parallel to the light-emitting layer 122, contribute to the axial radiant flux.

The simulation results in Table 1 show that the light extraction efficiency improving effect is higher for Roughened Face A than for Roughened Face B. The results also indicate that the nitride LED 100 in which the back face of the GaN substrate 110 is Roughened Face A has a very high axial radiant flux compared with when the back face is Roughened Face B. The latter finding means that the axial luminous intensity of a light-emitting device in which a nitride LED 100 has been flip-chip mounted is much higher when the back face of the GaN substrate 110 is Roughened Face A than when it is Roughened Face B.

The invention has been described above based on concrete embodiments thereof, although it is not limited to the embodiments set forth in the specification and may be variously modified within a range that does not depart from the gist of the invention.

(Addendum)

In addition, the following inventions are disclosed.

(E1) A semiconductor device which is formed on a first side of a nitride semiconductor substrate or nitride semiconductor layer, the semiconductor device having a nitride semiconductor film doped with hafnium to a concentration of at least $1\times10^{19}$ cm$^{-3}$ and not more than $2\times10^{21}$ cm$^{-3}$, and an electrode pad formed on a surface of the nitride semiconductor film.

(E2) The semiconductor device according to (E1) above, which has a light-emitting structure composed of a nitride semiconductor on a second side of the nitride semiconductor substrate or nitride semiconductor layer.

(E3) The semiconductor device according to (E2) above, wherein the nitride semiconductor film is formed so as to cover all or substantially all of the first side of the nitride semiconductor substrate or nitride semiconductor layer.

(E4) The semiconductor device according to (E3) above, wherein the nitride semiconductor film has a thickness of from 0.1 to 5 μm.

(E5) The semiconductor device according to (E4) above, wherein the nitride semiconductor substrate or nitride semiconductor layer has a carrier concentration of not more than $5×10^{17}$ cm$^{-3}$.

(E6) The semiconductor device according to any one of (E2) to (E5) above, wherein a roughened region and a flat region are provided on the surface of the nitride semiconductor film and the electrode pad is formed on the flat region.

(E7) A method of manufacturing a semiconductor device, including a first step of forming a nitride semiconductor film doped with hafnium to a concentration of at least $1×10^{19}$ cm$^{-3}$ and not more than $2×10^{21}$ cm$^{-3}$ on a first side of a nitride semiconductor substrate or nitride semiconductor layer, and a second step of forming an electrode pad on a surface of the nitride semiconductor film.

(E8) The manufacturing method according to (E7) above, wherein a light-emitting structure composed of a nitride semiconductor is provided on a second side of the nitride semiconductor substrate or the nitride semiconductor layer.

(E9) The manufacturing method according to (E8) above, wherein the nitride semiconductor film is formed so as to cover all or substantially all of the first side of the nitride semiconductor substrate or nitride semiconductor layer.

(E10) The manufacturing method according to (E9) above, wherein the nitride semiconductor film has a thickness of from 0.1 to 5 μm.

(E11) The manufacturing method according to (E10) above, wherein the carrier concentration of the nitride semiconductor substrate or nitride semiconductor layer is not more than $5×10^{17}$ cm$^{-3}$.

(E12) The manufacturing method according to any one of (E8) to (E11) above, which method comprises, after the first step, a third step of providing a roughened region and a flat region on the surface of the nitride semiconductor film, and in the second step forms the electrode pad on the flat region.

(E13) The manufacturing method according to any one of (E7) to (E12), which method comprises, after the first step, a fourth step of wet etching or dry etching at least part of the surface of the nitride semiconductor film without using a mask pattern so as to form a natural roughened face.

(E14) The manufacturing method according to (E7) to (E13) above, wherein the film-forming temperature of the nitride semiconductor film in the first step is not more than 700° C.

(E15) The manufacturing method according to (E7) to (E14) above, wherein the nitride semiconductor film-forming method in the first step includes a pulsed excitation deposition (PXD) process.

While the invention has been described in detail and with reference to specific embodiments thereof, it will be apparent to one skilled in the art that various changes and modifications can be made therein without departing from the spirit and scope thereof.

EXPLANATION OF REFERENCE NUMERALS

100, 101, 102, 103, 200, 300: nitride LED
110, 210, 310: GaN substrate
110a, 210a, 310a: front face
110b, 210b, 310b: back face
110b-1, 210b-1, 310b-1: roughened region
110b-2, 210b-2, 310b-2: flat region
120, 220, 320: multilayer epitaxial film
121, 221, 321: n-type layer
122, 222, 322: active layer
123, 223, 323: p-type layer
130, 230, 330: translucent electrode
140, 240, 340: p-type electrode pad
150, 250, 350: n-type electrode pad
160, 260, 360: passivation film
S1, S2, S3: supporting member

The invention claimed is:

1. A method of manufacturing a nitride LED, comprising a first step of providing a roughened region on a back face of a nitride semiconductor substrate having, on a front face thereof, a light-emitting structure made of a nitride semiconductor,
wherein the roughened region has a plurality of protrusions,
each of the plurality of protrusions has a top point or top plane and has a horizontal cross-section which is circular, except in areas where the protrusion is tangent to other neighboring protrusions, and which has a surface area that decreases on approaching the top point or top plane,
the plurality of protrusions are arranged such that any one protrusion is in contact with six other protrusions, and
in the first step, the roughened region is formed by dry etching treatment of the substrate.

2. A method of manufacturing a nitride LED, comprising:
a first step of preparing a nitride semiconductor stack which comprises a nitride semiconductor substrate and a light-emitting portion formed of a nitride semiconductor having a multilayer film structure stacked on the substrate; and
a second step of providing a roughened region on a substrate side face of the stack,
wherein the roughened region has a plurality of protrusions,
each of the plurality of protrusions has a top point or top plane and has a horizontal cross-section which is circular, except in areas where the protrusion is tangent to other neighboring protrusions, and which has a surface area that decreases on approaching the top point or top plane,
the plurality of protrusions are arranged such that any one protrusion is in contact with six other protrusions, and
in the second step, the roughened region is formed by dry etching treatment of the nitride semiconductor stack.

3. A method of manufacturing a nitride LED, comprising:
a first step of preparing a multilayer structure in which a plurality of nitride semiconductor layers including an n-type nitride semiconductor layer, an active layer and a p-type nitride semiconductor layer are stacked on one face of a first nitride semiconductor layer; and
a second step of providing a roughened region on another face of the first nitride semiconductor layer,
wherein the roughened region has a plurality of protrusions,
each of the plurality of protrusions has a top point or top plane and has a horizontal cross-section which is circular, except in areas where the protrusion is tangent to other neighboring protrusions, and which has a surface area that decreases on approaching the top point or top plane,
the plurality of protrusions are arranged such that any one protrusion is in contact with six other protrusions, and
in the second step, the roughened region is formed by dry etching treatment of the first nitride semiconductor layer.

4. The manufacturing method according to claim 1, wherein each of the plurality of protrusions has a peripheral shape which, in a top view of the roughened region, is a hexagon.

5. The manufacturing method according to claim 4, wherein each of the plurality of protrusions has a peripheral shape which, in a top view of the roughened region, is a regular hexagon.

6. The manufacturing method according to claim 1, wherein each of the plurality of protrusions is located at a lattice position of a triangular lattice, and each of the plurality of protrusions has a height which is from 0.4 to 1.5 times the pitch of the triangular lattice.

7. The manufacturing method according to claim 1, wherein each of the plurality of protrusions has a height of from 1 to 8 μm.

* * * * *